US010217861B2

(12) United States Patent
Yamaji

(10) Patent No.: US 10,217,861 B2
(45) Date of Patent: Feb. 26, 2019

(54) HIGH VOLTAGE INTEGRATED CIRCUIT WITH HIGH VOLTAGE JUNCTION TERMINATION REGION

(71) Applicant: FUJI ELECTRIC CO., LTD., Kawasaki-shi, Kanagawa (JP)

(72) Inventor: Masaharu Yamaji, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/452,035

(22) Filed: Mar. 7, 2017

(65) Prior Publication Data

US 2017/0271506 A1    Sep. 21, 2017

(30) Foreign Application Priority Data

Mar. 18, 2016    (JP) ................................. 2016-056061

(51) Int. Cl.
*H01L 29/10*     (2006.01)
*H01L 29/40*     (2006.01)
*H01L 29/78*     (2006.01)

(52) U.S. Cl.
CPC ...... *H01L 29/7823* (2013.01); *H01L 29/1095* (2013.01); *H01L 29/405* (2013.01)

(58) Field of Classification Search
CPC .. H01L 29/06–29/0646; H01L 29/0692; H01L 29/0696; H01L 29/402–29/407; H01L 29/7823
See application file for complete search history.

(56) References Cited

U.S. PATENT DOCUMENTS

| 5,894,156 A | 4/1999 | Terashima et al. |
| 6,150,702 A | 11/2000 | Funaki et al. |
| 2004/0046225 A1 | 3/2004 | Feller |
| 2007/0085595 A1 | 4/2007 | Taki et al. |
| 2010/0148823 A1* | 6/2010 | Shimizu ............... H01L 27/0629 326/102 |
| 2014/0048911 A1 | 2/2014 | Suzuki et al. |

(Continued)

FOREIGN PATENT DOCUMENTS

| JP | H09-283716 A | 10/1997 |
| JP | 2000-022175 A | 1/2000 |
| JP | 2003-008009 A | 1/2003 |

(Continued)

*Primary Examiner* — Lex H Malsawma
*Assistant Examiner* — Gardner W. S. Swan
(74) *Attorney, Agent, or Firm* — Rabin & Berdo, P.C.

(57) ABSTRACT

An nchMOSFET of a level-raising circuit is arranged in a high voltage junction termination region (HVJT), to be integrated with a parasitic diode formed by an n⁻-type diffusion region and a second p-type separation region. On a high potential side of the HVJT, a first field plate (FP) also acting as a drain electrode of the nchMOSFET and a second FP also acting as a cathode electrode of a parasitic diode are arranged away from each other. On a low potential side the HVJT, a third electrode also acting as a source electrode of the nchMOSFET is arranged in a planar layout surrounding the periphery of a high potential side region. On an interlayer insulating film, an interval between a first portion of the third FP and a fourth portion of the first FP is larger than an interval between the second and the third FPs.

13 Claims, 31 Drawing Sheets

(56) References Cited

U.S. PATENT DOCUMENTS

2014/0167171 A1* 6/2014 Kaya .................... H01L 29/404
257/367

FOREIGN PATENT DOCUMENTS

| JP | 2003-533886 A | 11/2003 |
| --- | --- | --- |
| JP | 2005-123512 A | 5/2005 |
| JP | 5748353 B2 | 7/2015 |

* cited by examiner

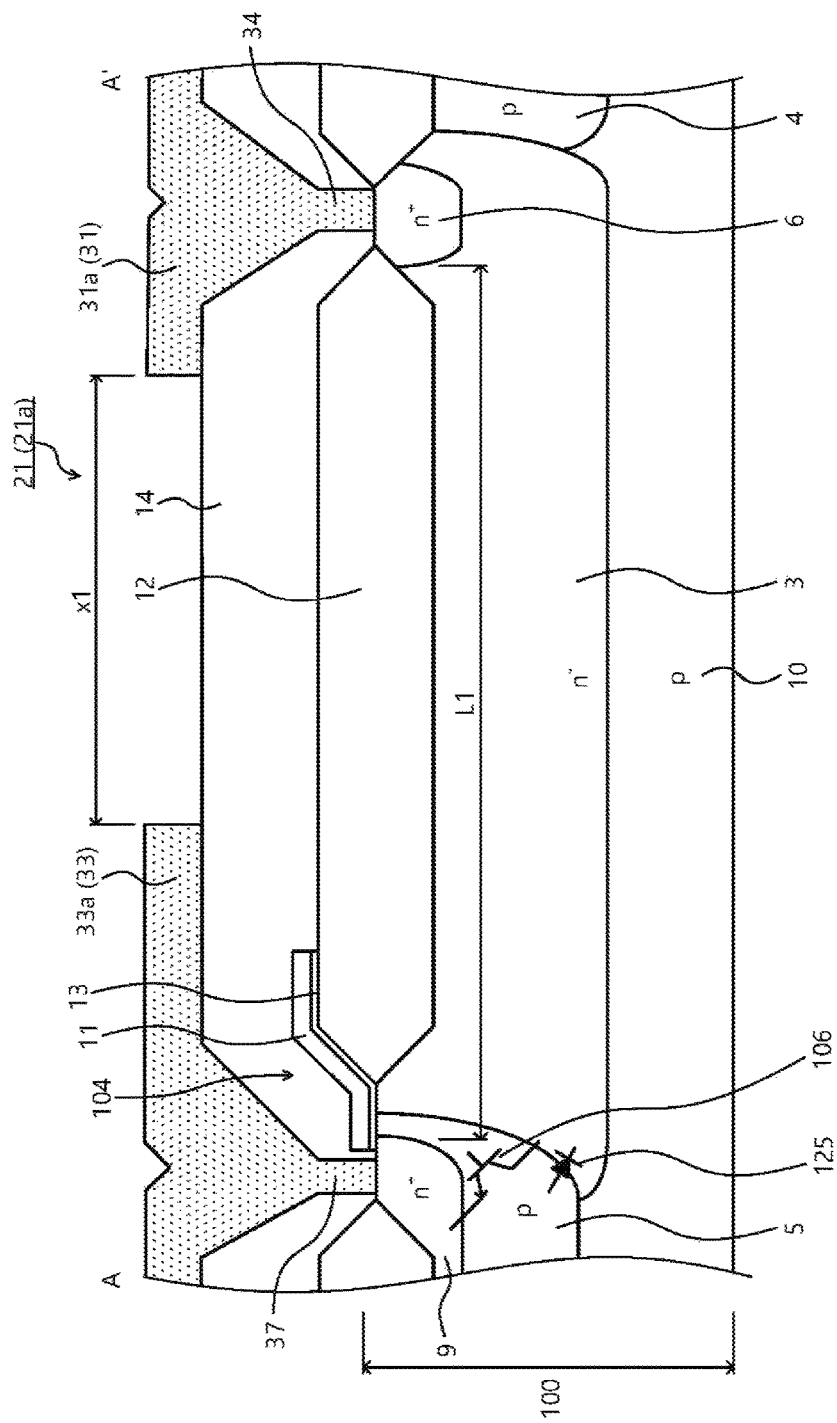

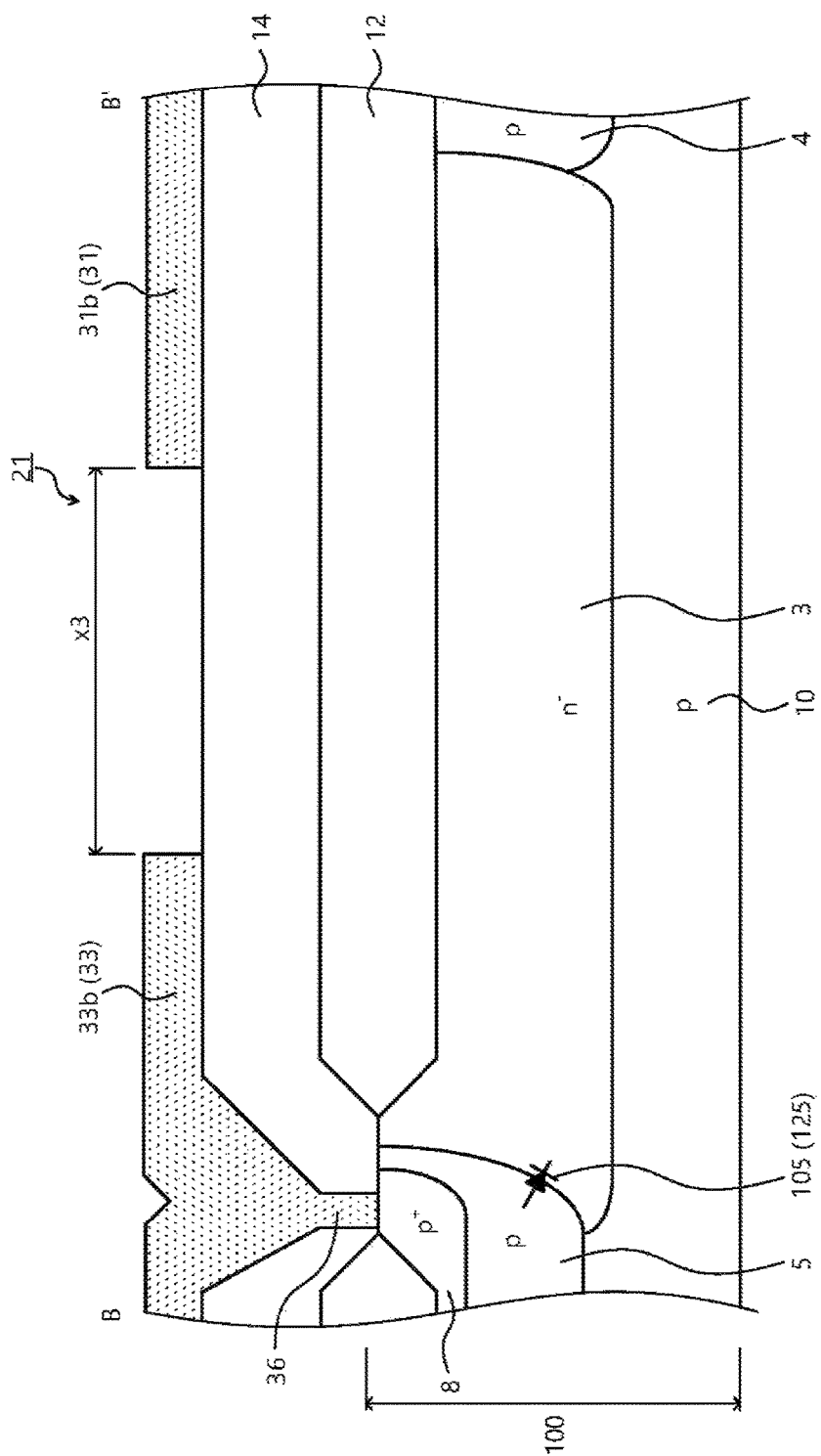

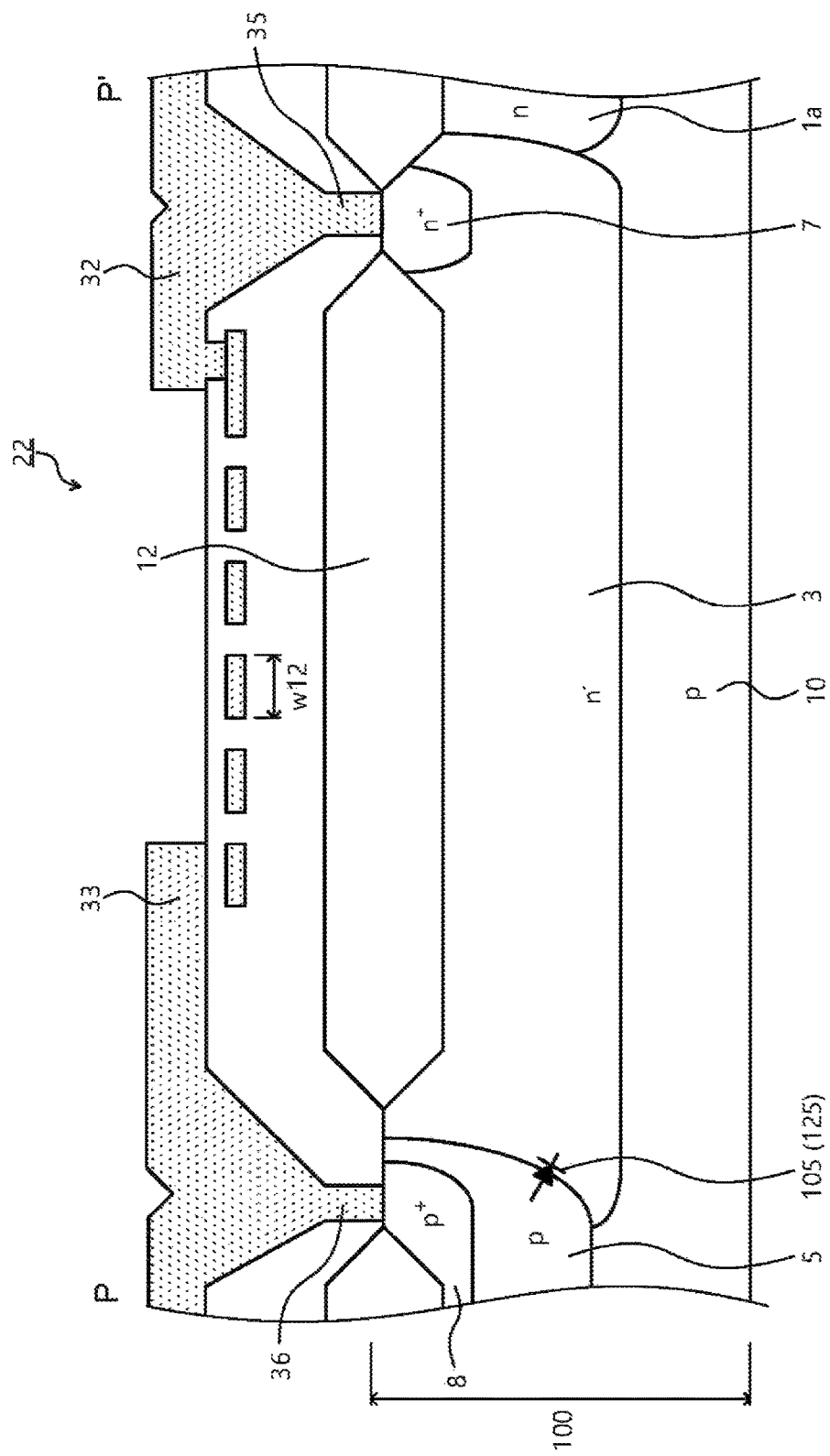

RELATED ART

RELATED ART

RELATED ART

HIGH VOLTAGE INTEGRATED CIRCUIT WITH HIGH VOLTAGE JUNCTION TERMINATION REGION

CROSS REFERENCE TO RELATED APPLICATIONS

This application is based upon and claims the benefit of priority of the prior Japanese Patent Application No. 2016-056061, filed on Mar. 18, 2016, the entire contents of which are incorporated herein by reference.

BACKGROUND OF THE INVENTION

1. Field of the Invention

Embodiments of the invention relate to a semiconductor device.

2. Description of the Related Art

For a high voltage integrated circuit (HVIC), an element separation scheme using a high voltage junction has been known traditionally in which a high potential side (a high side) region and a low potential side (a low side) region provided on a single semiconductor chip are electrically separated from each other by a high voltage junction termination region (HVJT) that is provided between the regions.

It is known that a high voltage n-channel metal oxide semiconductor field effect transistor (MOSFET) functioning as a level-raising circuit is arranged in the HVJT (see, for example, Japanese Laid-Open Patent Publication Nos. H9-283716 and 2005-123512). Signal transmission is executed between the high potential region and the low potential region through these level-shift circuits.

Configuration of traditional HVICs will be described. FIGS. 23, 24, 25, and 26 are plan diagrams examples of a planar layout of essential portions of traditional semiconductor devices. FIGS. 23 and 24 are respectively FIGS. 1 and 8 of Japanese Laid-Open Patent Publication No. H9-283716 and FIG. 26 is FIG. 6 of Japanese Laid-Open Patent Publication No. 2005-123512. The traditional semiconductor device depicted in FIG. 23 includes a high potential side region 211 and a low potential side region 212 on a single p$^-$-type semiconductor substrate 201, and is configured to electrically separate these regions from each other using an HVJT 213. The high potential side region 211 is an n-type region 202 provided on the p$^-$-type semiconductor substrate 201. The low potential side region 212 is a portion of the p$^-$-type semiconductor substrate 201 located farther outward (closer to the periphery of the chip) than an n$^-$-type region 203.

The HVJT 213 is the n$^-$-type region 203 that surrounds the periphery of the n-type region 202. A portion 204 of the p$^-$-type semiconductor substrate 201 (hereinafter, referred to as "p$^-$-type separation region") is in between the n-type region 202 and the n$^-$-type region 203 to have a substantially U-shaped planar layout starting from the low potential side region 212 and returning to the low potential side region 212 through the HVJT 213 and the high potential side region 211. The p$^-$-type separation region 204 electrically separates from other portions, portions 202a and 203a of a portion in which the n-type region 202 and the n$^-$-type region 203 are continuous with each other. An n-channel MOSFET used as a level shifter 214 is arranged in the portions 202a and 203a surrounded by the p$^-$-type separation region 204. A reference numeral "217" denotes a parasitic diode in a region other than the level shifter 214 of the HVJT 213 (similarly in FIGS. 24 to 26).

In the traditional semiconductor device depicted in FIG. 24, a p$^-$-type separation region 205 arranged in a substantially rectangular frame planar layout inside the n-type region 202 separates a portion 202b on the outer side of the n-type region 202 (hereinafter, referred to as "peripheral edge portion") and a portion on the inner side of the n-type region 202 (hereinafter, referred to as "central portion") from each other. An n-channel MOSFET is arranged to be used as the level shifter 214 that uses a portion of the n$^-$-type region 203 as a drift region. The arrangement of the high potential side region 211, the low potential side region 212, and the HVJT 213 of the traditional semiconductor device depicted in FIG. 24 is same as that of the traditional semiconductor device depicted in FIG. 23 (similarly in FIGS. 25 and 26).

In the traditional semiconductor device depicted in FIG. 25, a p-type separation region 206 arranged in a substantially C-shaped planar layout inside the n-type region 202 separates a portion 202c along three sides of the peripheral edge portion of the n-type region 202 arranged in a rectangular planar layout and the central portion of the n-type region 202 from each other. An n-channel MOSFET is arranged to be used as the level shifter 214 that uses, as a drift region, a portion of the n$^-$-type region 203 facing the high potential side region 211 sandwiching the n$^-$-type separation region 206 therebetween.

A portion 202d of the n-type region 202 along the other one side not separated by the p$^-$-type separation region 206 has a potential that is fixed at the maximal potential of the high potential side region 211. Resistance of a diffusion region is used as level-shift resistance, between the portion 202d whose potential is fixed at the maximal potential of the high potential side region 211 and the drain region not depicted of the re-channel MOSFET that constitutes the level shifter 214. A reference numeral "208" denotes a p$^-$-type region constituting a parasitic diode 217.

In the traditional semiconductor device depicted in FIG. 26, a portion of the HVJT 213 is separated by trenches 207 (for example, at two points) and, in the regions each surrounded by the trench 207, an n-channel MOSFET and a p-channel MOSFET are arranged that are used as the level shifters 214 (214a and 214b). Reference numerals "215" and "216" each denote a wire.

With a configuration to use a portion of the HVJT 213 as the level shifter 214 as above, the p$^-$-type separation regions 204 to 206 or the trenches 207 electrically separate the region having the inner circuits arranged therein of the high potential side region 211 and the level shifter 214 of the HVJT 213 from each other. High potential wiring that extends from the low potential side region 212 to the high potential side region 211 passing over the HVJT 213 is thereby unnecessary and the reliability is therefore high. Compared to a configuration to have the level shifter 214 arranged in a region other than the HVJT 213, the chip size may be reduced (shrunk) by the footprint of the level shifter 214.

To stably secure a high breakdown voltage, a high voltage diode, a high voltage MOSFET, and the like each often include a field plate (FP) arranged to extend on an interlayer insulating film as an edge termination structure. A resistive field plate (RFP) and the like that, inside the interlayer insulating film, includes a thin film resistive layer arranged in a spiral planar layout to surround the periphery of the high potential side region starting from the high potential side region reaching the low potential side region are known as field plates (see Japanese Laid-Open Patent Publication Nos.

2000-022175 and 2003-008009, International Patent Publication No. 2003-533886, and Japanese Patent Publication No. 5748353).

SUMMARY OF THE INVENTION

According to one aspect of the present invention, a semiconductor device includes a first semiconductor region of a second conductivity type, selectively provided in a surface layer of a semiconductor substrate; a second semiconductor region of the second conductivity type and surrounding a periphery of the first semiconductor region; a third semiconductor region of a first conductivity type, provided to be in contact with the second semiconductor region and to surround and to be away from the first semiconductor region; a fourth semiconductor region of the second conductivity type, selectively provided in the third semiconductor region; a fifth semiconductor region of the second conductivity type, selectively provided in the first semiconductor region or the second semiconductor region to face the fourth semiconductor region, the fifth semiconductor region having an impurity concentration that is higher than that of the second semiconductor region; a gate electrode provided through a gate insulating film, on a surface of a portion of the third semiconductor region between the fourth semiconductor region and the second semiconductor region; a sixth semiconductor region of the second conductivity type, selectively provided in the first semiconductor region or the second semiconductor region to be away from the fifth semiconductor region, the sixth semiconductor region having an impurity concentration that is higher than that of the second semiconductor region; a seventh semiconductor region of the first conductivity type, selectively provided in the first semiconductor region to be away from the fifth semiconductor region; an interlayer insulating film that covers the second semiconductor region; a first electrode electrically connected to the fifth semiconductor region, and extending on the interlayer insulating film; a second electrode electrically connected to the sixth semiconductor region or the seventh semiconductor region, and extending on the interlayer insulating film; and a third electrode electrically connected to the third semiconductor region and the fourth semiconductor region, and extending on the interlayer insulating film to face the first electrode and the second electrode. On the interlayer insulating film, an interval between the first electrode and a first portion of the third electrode, facing the fourth semiconductor region in a depth direction is larger than an interval between the second electrode and the third electrode.

In the semiconductor device, on the interlayer insulating film, the interval between the first portion and the first electrode is equal to or larger than an interval between the first electrode and a second portion other than the first portion of the third electrode.

In the semiconductor device, a third portion of the first electrode, facing the second portion of the third electrode overhangs more on the interlayer insulating film toward a side of the third electrode than a fourth portion of the first electrode, facing the first portion of the third electrode.

The semiconductor device includes a fourth electrode electrically connected to the seventh semiconductor region or the sixth semiconductor region, and extending on the interlayer insulating film, the fourth electrode being provided away from the second electrode. On the interlayer insulating film, the interval between the first portion of the third electrode and the first electrode is larger than an interval between the second portion of the third electrode and the fourth electrode.

According to another aspect of the invention, a semiconductor device includes a first semiconductor region of a second conductivity type, selectively provided in a surface layer of a semiconductor substrate; a second semiconductor region of the second conductivity type and surrounding a periphery of the first semiconductor region; a third semiconductor region of a first conductivity type, provided to be in contact with the second semiconductor region and to surround and to be away from the first semiconductor region; a fourth semiconductor region of the second conductivity type, selectively provided in the third semiconductor region; a fifth semiconductor region of the second conductivity type, selectively provided in the first semiconductor region or the second semiconductor region to face the fourth semiconductor region, the fifth semiconductor region having an impurity concentration that is higher than that of the second semiconductor region; a gate electrode provided through a gate insulating film, on a surface of a portion of the third semiconductor region between the fourth semiconductor region and the second semiconductor region; a sixth semiconductor region of the second conductivity type, selectively provided in the first semiconductor region or the second semiconductor region to be away from the fifth semiconductor region, the sixth semiconductor region having an impurity concentration that is higher than that of the second semiconductor region; a seventh semiconductor region of the first conductivity type, selectively provided in the first semiconductor region to be away from the fifth semiconductor region; an interlayer insulating film that covers the second semiconductor region; a first electrode electrically connected to the fifth semiconductor region; a second electrode electrically connected to the sixth semiconductor region or the seventh semiconductor region; a third electrode electrically connected to the third semiconductor region and the fourth semiconductor region; and a fourth electrode provided in the interlayer insulating film between the second electrode and the third electrode. The fourth electrode has a width that is smaller at a first portion thereof that faces the fourth semiconductor region than at a second portion thereof.

In the semiconductor device, the fourth electrode connected to the second electrode and the third electrode and includes a resistive body arranged in a spiral layout so as to surround a periphery of the first semiconductor region and reach a side of the third semiconductor region from a side of the first semiconductor region.

In the semiconductor device, the fourth electrode includes a plurality of conductor layers arranged in an annular layout so as to surround a periphery of the first semiconductor region and to be away from each other.

In the semiconductor device, the fourth electrode includes polysilicon.

In the semiconductor device, the first electrode and the second electrode are arranged to be away from each other and in a layout so as to form a ring surrounding the periphery of the first semiconductor region.

In the semiconductor device, the third electrode is arranged to be away from the first electrode and the second electrode and to be positioned farther outward than the first electrode and the second electrode, the third electrode arranged in a layout so as to surround the periphery of the first semiconductor region.

Objects, features, and advantages of the present invention are specifically set forth in or will become apparent from the

BRIEF DESCRIPTION OF THE DRAWINGS

FIG. 2A is a cross-sectional view taken along a cutting line A-A' in FIG. 1A;

FIG. 3A is a cross-sectional view taken along a cutting line B-B' in FIG. 1A;

FIG. 8B is a cross-sectional view taken along a cutting line P-P' in FIG. 5;

DETAILED DESCRIPTION OF THE INVENTION

Figure 1A:
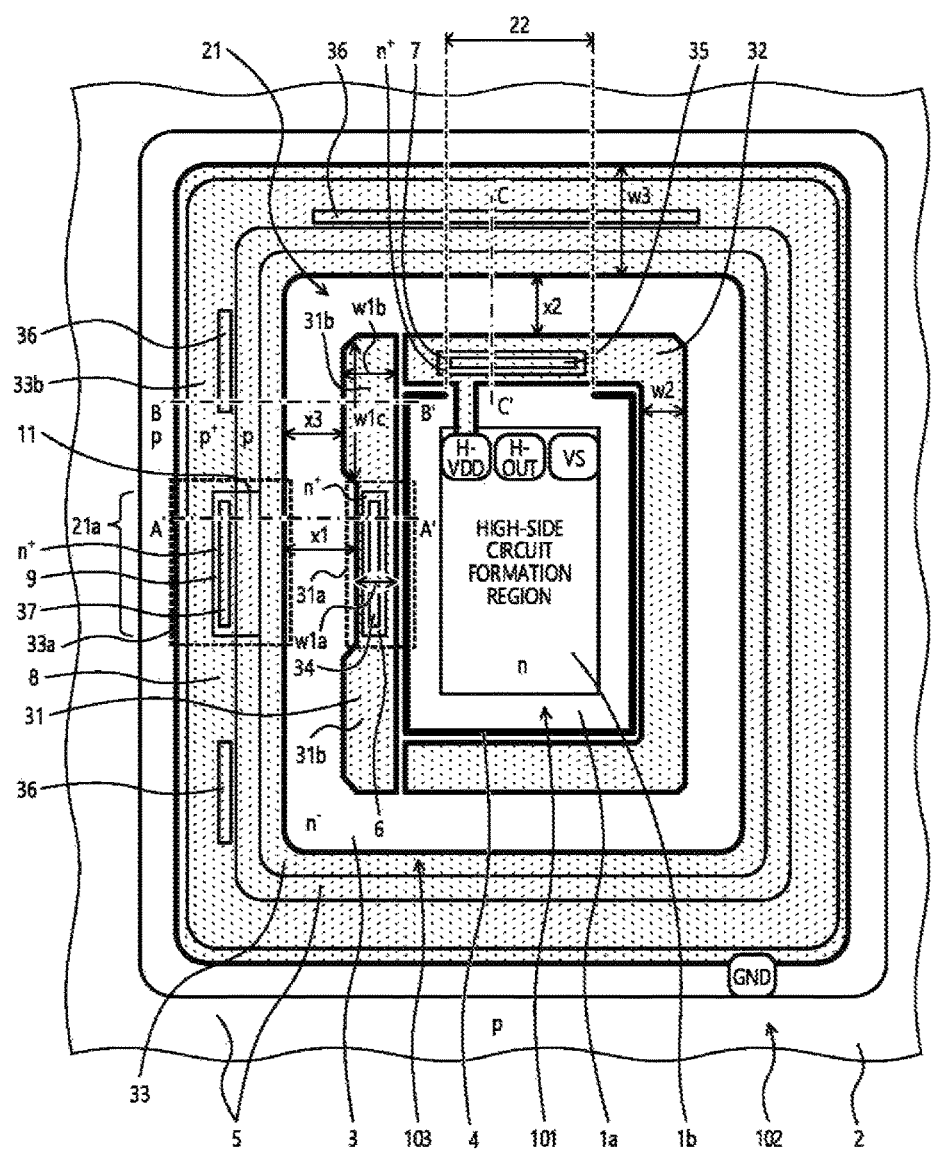
FIG. 1A is a plan diagram of a planar layout of a semiconductor device according to a first embodiment.

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

A configuration of a high voltage integrated circuit (HVIC) as a semiconductor device according to a first embodiment will be described. FIG. 1A is a plan diagram of a planar layout of the semiconductor device according to the first embodiment. The planar layout refers to the planar shapes and the arrangement configuration of the components as viewed from a front surface side of a semiconductor substrate 100. FIG. 1A depicts a state of the semiconductor substrate (a semiconductor chip) 100 as viewed from the front surface side thereof (similarly in FIGS. 5 and 9). For example, description will be given taking an example of an HVIC that drives, of two insulated gate bipolar transistors (IGBTs) connected to each other in series and constituting a portion corresponding to one phase of an electric power converting bridge circuit, the IGBT on the high potential side (the high side) (hereinafter, referred to as "upper arm IGBT").

The semiconductor device according to the first embodiment depicted in FIG. 1A is an HVIC that includes a high potential side region 101 and a low potential side region 102 on the same semiconductor substrate 100 and that electrically separates these regions from each other using an HVJT 103. The high potential side region 101 includes an n-type diffusion region (a first semiconductor region) 1a that is arranged in a substantially rectangular planar layout. The n-type diffusion region 1a is electrically connected to the maximal potential (a high-side power source potential) "H-VDD" of a high-side circuit portion not depicted. The n-type diffusion region 1a has a high-side circuit formation region 1b arranged therein. The high-side circuit formation region 1b has electrode pads of the high-side circuit portion arranged therein.

The high-side circuit formation region 1b has a high-side circuit portion, a configuration portion excluding an n-channel MOSFET (hereinafter, referred to as "nchMOSFET") 104 of a level-raising circuit described later, and the like arranged therein. The high-side circuit portion is, for example, a complementary MOS (CMOS) circuit that operates using the high-side power source potential H-VDD as the power source potential and an emitter potential VS of the upper arm IGBT of the electric power converting bridge circuit as the reference potential (see reference numeral "146" of FIG. 22). The configuration portion excluding the nchMOSFET 104 of the level-raising circuit is, for example, a level-shift resistor of the level-raising circuit.

The low potential side region 102 includes a portion (hereinafter, referred to as "p-type substrate region") 2 of the n-type semiconductor substrate 100 present farther outward than the HVJT 103. The p-type substrate region 2 has a potential that is fixed at, for example, the ground potential GND, which is the minimum potential of the HVIC. The p-type substrate region 2 has, for example, an n-type diffusion region not depicted to be a rear gate selectively provided, and the n-type diffusion region has the low-side circuit portion not depicted and the like arranged therein. The low-side circuit portion is a CMOS circuit that operates using a power source potential (a low side power source potential) VCC that is lower than a high-side power source potential H-VDD as the power source potential and the minimum potential of the HVIC as the reference potential.

An n$^-$-type diffusion region (a second semiconductor region) 3 to be a breakdown voltage region is arranged between the n-type diffusion region 1a and the p-type substrate region 2. An n$^-$-type diffusion region 3 is arranged in, for example, a substantially rectangular frame (ring) planar layout surrounding the periphery of the n-type diffusion region 1a. The n$^-$-type diffusion region 3 is electrically separated from a portion of the n-type diffusion region 1a by a first p-type separation region 4 that is electrically connected to the ground potential GND. FIG. 1A depicts the first p-type separation region 4 using a thick line (similarly in FIGS. 5, 9, 13, and 17 to 20). The n$^-$-type diffusion region 3 is in contact with the n-type diffusion region 1a at a portion (a second HVJT portion 22 described later) in which the first p-type separation region 4 is not present between the n$^-$-type diffusion region 3 and the n-type diffusion region 1a. The n$^-$-type diffusion region 3 is electrically separated from the p-type diffusion region 2 by a second p-type separation region (a third semiconductor region) 5 that is electrically connected to the ground potential GND.

On the high potential side of the n$^-$-type diffusion region 3, an n$^+$-type drain region (a fifth semiconductor region) 6 of the nchMOSFET 104 is arranged in a portion (a first HVJT portion 21 described later) in which the first p-type separation region 4 is present between the n$^-$-type diffusion region 3 and the n-type diffusion region 1a. When the first p-type separation region 4 is arranged inside the n-type diffusion region 1a, the n$^+$-type drain region 6 may be arranged in a portion of the n-type diffusion region 1a present farther outward than the first p-type separation region 4.

On the high potential side of the n$^-$-type diffusion region 3, an n$^+$-type pick-up region (a sixth semiconductor region) 7 at the high-side power source potential H-VDD is arranged in a portion (the second HVJT portion 22 described later) in which the first p-type separation region 4 is not present between the n$^-$-type diffusion region 3 and the n-type diffusion region 1a. FIG. 1A depicts the border between the first and the second HVJT portions 21 and 22 using a dotted line (the same is applied to FIGS. 5 and 9). The n$^+$-type pick-up region 7 may be arranged in the n-type diffusion region 1a. The n$^+$-type pick-up region 7 functions as a cathode contact region of a parasitic diode 125 of the HVJT 103 described later.

The first p-type separation region 4 is arranged in, for example, a substantially U-shaped or a substantially C-shaped planar layout that, for example, surrounds the periphery of the high-side circuit formation region 1b between the n-type diffusion region 1a and the n$^-$-type diffusion region 3. The first p-type separation region 4 only has to be arranged away from the second p-type separation region 5, and may be arranged in the n-type diffusion region 1a or may be arranged in the n$^-$-type diffusion region 3. When the first p-type separation region 4 is arranged in the n-type diffusion region 1a, the high-side circuit formation region 1b is arranged in the first p-type separation region 4.

The second p-type separation region 5, for example, is in contact with the n$^-$-type diffusion region 3 and is arranged in a planar layout surrounding the periphery of the n$^-$-type diffusion region 3. The second p-type separation region 5 may be arranged inside the peripheral edge portion of the n$^-$-type diffusion region 3. The second p-type separation region 5 has an electrode pad at the ground potential (hereinafter, referred to as "GND pad") arranged therein. The second p-type separation region 5 has a p$^+$-type contact region 8 arranged therein in a substantially rectangular frame planar layout away from the n$^-$-type diffusion region 3 and surrounding the periphery of the n$^-$-type diffusion region 3. The p$^+$-type contact region 8 functions as an anode contact region of the parasitic diode 125 of the HVJT 103 described later.

The n$^-$-type diffusion region 3, the first and the second p-type separation regions 4 and 5, and the p$^+$-type contact region 8 are arranged in concentric circular (substantially rectangular frame) planar layouts surrounding the periphery of the high-side circuit formation region 1b. The pn-junction between the second p-type separation region 5 and the n$^-$-type diffusion region 3 forms the parasitic diode 125 (see FIG. 3 described later). This parasitic diode 125 constitutes the HVJT 103. The high potential side region 101 and the low potential side region 102 may be electrically separated from each other with a high breakdown voltage by providing the HVJT 103 between the high potential side region 101 and the low potential side region 102.

On the high potential side of the HVJT 103, a first FP and a second FP (a first and a second electrodes) 31 and 32 are arranged away from each other. The first FP 31 is in contact with the n$^+$-type drain region 6 of the nchMOSFET 104. A contact (an electric contact portion) 34 between the first FP 31 and the n$^+$-type drain region 6 is arranged in, for example, a substantially straight linear planar layout having a substantially same size (an area and a shape) as that of the n$^+$-type drain region 6. The second FP 32 is in contact with the n$^+$-type pick-up region 7. A contact 35 between the second FP 32 and the n$^+$-type pick-up region 7 is arranged in, for example, a substantially straight linear planar layout having a substantially same size as that of the n$^+$-type pick-up region 7. The second FP 32 is connected to an electrode pad at the high-side power source potential (hereinafter, referred to as "H-VDD pad"). The first and the second FPs 31 and 32 each extends toward the low potential side on an interlayer insulating film not depicted, and each has a function of equalizing the surface potential distribution of the HVJT 103.

On the low potential side of the HVJT 103, a third FP (a third electrode) 33 is arranged away from the first and the second FPs 31 and 32. The third FP 33 is in contact with the p$^+$-type contact region 8. A contact 36 between the third FP 33 and the p$^+$-type contact region 8 is arranged in a substantially straight linear planar layout. The contact 36 may be arranged in plural between the third FP 33 and the p$^+$-type contact region 8. The third FP 33 is in contact with an n$^+$-type source region (a fourth semiconductor region) 9 of the nchMOSFET 104 described later. A contact 37 between the third FP 33 and the n$^+$-type source region 9 is arranged in, for example, a substantially straight linear planar layout having a substantially same size as that of the n$^+$-type source region 9. The third FP 33 is connected to the GND pad and has a potential that is fixed at the ground potential GND.

The third FP 33 extends toward the high potential side on the interlayer insulating film, and has a function of equalizing the surface potential distribution of the HVJT 103. The second and the third FPs 32 and 33 respectively function as a cathode electrode and an anode electrode of the parasitic diode 125 of the HVJT 103. In FIG. 1A, the first to the third FPs 31 to 33 are hatched portions each surrounded by a thick line frame (similarly in FIGS. 5 and 9). FIG. 1A depicts a case where the contacts 36 of the third FP 33 are arranged at three points (in the vicinity of the n$^+$-type source region 9 of the third FP 33 and a portion facing the n$^+$-type pick-up region 7 of the second FP 32 sandwiching the n$^-$-type diffusion region 3 therebetween) (similarly FIGS. 5 and 9). The planar layouts of the first to the third FPs 31 to 33 will be described later in detail.

The first HVJT portion 21 is a portion that has the first p-type separation region 4 present between the n-type diffusion region 1a and the n$^-$-type diffusion region 3, and that has the n-type diffusion region 1a and the n$^-$-type diffusion region 3 electrically separated from each other therein. The first HVJT portion 21 is a substantially U-shaped portion or a substantially C-shaped portion corresponding substantially to the three sides of the n$^-$-type diffusion region 3 that has a substantially rectangular frame shape. The first HVJT portion 21 has the nchMOSFET 104 of the level-raising circuit arranged therein. Although FIG. 1A depicts a case where the one nchMOSFET 104 is arranged in the first HVJT portion 21, when the nchMOSFET 104 is arranged in plural, preferably, the nchMOSFETs 104 are arranged at positions at which the distances from the second HVJT portion 22 are equal to each other.

The nchMOSFET 104 uses the n$^-$-type diffusion region 3, the second p-type separation region 5, the p$^+$-type contact region 8, and the first and the third FPs 31 and 33 respectively as a drift region, a base region, a base contact region, a drain electrode, and a source electrode. The n$^+$-type source region 9 of the nchMOSFET 104 is arranged in the second p-type separation region 5 to face the n$^+$-type drain region 6, and to be in contact with the p$^+$-type contact region 8. The n$^+$-type source region 9 is in contact with the third FP 33 through the contact 37 as above. A gate electrode 11 of the nchMOSFET 104 is arranged in a portion between the n$^+$-type source region 9 and the n$^-$-type diffusion region 3, of the second p-type separation region 5.

The second HVJT portion 22 is a portion exclusive of the first HVJT portion 21 of the n$^-$-type diffusion region 3, and is a portion in which the n-type diffusion region 1a and the n$^-$-type diffusion region 3 are electrically connected to each other due to the absence of the first p-type separation region 4 between the n-type diffusion region 1a and the n$^-$-type diffusion region 3. For example, the second HVJT portion 22 is a substantially straight linear portion corresponding to the remaining one side of the n$^-$-type diffusion region 3 that has a substantially rectangular frame shape. The borders between the second HVJT portion 22 and the first HVJT portion 21 are each indicated by a vertical dashed line. In this manner, the HVJT 103 has the nchMOSFET 104 arranged therein that is integrated with the parasitic diode 125.

The planar layouts of the first to the third FPs 31 to 33 will be described. The first FP 31 is arranged in the first HVJT portion 21. The first FP 31 is arranged in a portion (hereinafter, referred to as "MOS region") 21a of the first HVJT portion 21 where at least the nchMOSFET 104 arranged therein. The first FP 31 may extend to a portion other than the MOS region 21a of the first HVJT portion 21 (a portion not having the nchMOSFET 104 arrange therein) in a peripheral direction (the direction to surround the periphery of the high potential side region 101) on the interlayer insulating film 14. For example, the first FP 31 is arranged in a substantially straight linear planar layout along the one side of the n$^-$-type diffusion region 3 to include the MOS region 21a of the first HVJT portion 21.

The second FP 32 is arranged in the second HVJT portion 22. The second FP 32 may extend on the interlayer insulating film 14 from the second HVJT portion 22 to a portion other than the MOS region 21a of the first HVJT portion 21. For example, the second FP 32 is arranged in a substantially U-shaped planar layout or a substantially C-shaped planar layout along the other three sides of the n$^-$-type diffusion region 3. The first and the second FPs 31 and 32 are arranged away from each other and in one planar layout forming a substantially rectangular frame shape that surrounds the periphery of the high potential side region 101, to be present farther outward than the first p-type diffusion region 4. The third FP 33 is arranged in, for example, a substantially rectangular frame planar layout along the p$^+$-type contact region 8, at a position facing the p$^+$-type contact region 8 in the depth direction, sandwiching the interlayer insulating film 14 therebetween.

On the interlayer insulating film 14, an interval x1 between a portion (hereinafter, referred to as "first portion", a portion surrounded by a dashed-line rectangle) 33a of the third FP 33 and facing the n$^+$-type source region 9 in the depth direction, and a portion (hereinafter, referred to as "fourth portion", a portion surrounded by a dashed-line rectangle) 31a of the first FP 31 and facing the first portion, is larger than an interval x2 between the second and the third FPs 32 and 33 (x1>x2). On the interlayer insulating film 14, the interval x1 between the fourth portion 31a of the first FP 31 and the first portion 33a of the third FP 33 is larger than an interval x3 between a portion (hereinafter, referred to as "second portion") 33b of the third FP 33 exclusive of the first portion 33a and a portion (hereinafter, referred to as "third portion") 31b of the first FP 31 exclusive of the fourth portion 31a (x1>x3). Though not depicted, these intervals x1 and x3 may be equal to each other (x1=x3). The distance from the low potential side FP to the high potential side FP of the nchMOSFET 104 (the interval x1) is larger than the distance from the low potential side FP to the high potential side FP of the parasitic diode 105 of the region exclusive of the nchMOSFET 104 of the parasitic diode 125 of the HVJT 103 (the interval X2). The first portion 33a of the third FP 33 is a portion of the MOS region 21a of the first HVJT portion 21, of the third FP 33. The portion of the third FP 33 exclusive of the first portion 33a is the portion of the third FP 33 exclusive of the MOS region 21a of the first HVJT portion 21.

To relatively increase the interval x1 between the first portion 33a of the third FP 33 and the fourth portion 31a of the first FP 31 on the interlayer insulating film 14, the interval x3 between the second portion 33b of the third FP 33 and the third portion 31b of the first FP 31 only has to be reduced by, for example, configuring the planar shape of the third portion 31b of the first FP 31 to be a planar shape that overhangs more toward the low potential side (periphery of the chip) than the fourth portion 31a does. A width w1b in a direction orthogonal to the longitudinal direction of the third portion 31b of the first FP 31 (the direction parallel to the direction of the overhanging) is larger than a width w1a in the direction orthogonal to the circumferential direction of the fourth portion 31a of the first FP 31 (w1a<w1b). The third portion 31b of the first FP 31 may extend on the interlayer insulating film 14, to have a substantially trapezoidal planar shape and a width w1c in the longitudinal direction, decreasing toward the low potential side. The interval x3 between the third portion 31b of the first FP 31 and the second portion 33b of the third FP 33 may be reduced by causing the second portion 33b of the third FP 33 to extend toward the high potential side. These intervals x1 to x3 are each set to have a dimension by which the resistance to breakdown of the nchMOSFET 104 may be secured to the extent that no breakdown occurs when avalanche current flows during the OFF time period.

The surface electric field of the drift region of the nchMOSFET 104 (the n⁻-type diffusion region 3 of the MOS region 21a of the first HVJT portion 21) may be alleviated by relatively increasing the interval x1 between the FPs of the nchMOSFET 104 on the interlayer insulating film 14 as above. The applied voltage at which the nchMOSFET 104 succumbs to avalanche breakdown during the OFF time period (the OFF breakdown voltage) may thereby be configured to be relatively high. When a high voltage is applied to the H-VDD pad, the electric field concentrates at the relatively overhanging portions of the FPs (the third portion 31b of the first FP 31, the second FP 32, and the second portion 33b of the third FP 33) of the parasitic diode 105 of the HVJT 103. The parasitic diode 105 of the HVJT 103 succumbs to avalanche breakdown sooner than the nchMOSFET 104 does. The OFF breakdown voltage of the nchMOSFET 104 is therefore higher than the OFF breakdown voltage of the parasitic diode 105 of the HVJT 103 even when an interval (hereinafter, referred to as "high concentration region interval") L1 between the high concentration regions of the nchMOSFET 104 and an interval (hereinafter, referred to as "high concentration region interval") L2 between the high concentration regions of the parasitic diode 105 of the HVJT 103 are equal to each other.

The high concentration region interval L1 of the nchMOSFET 104 is the interval (the width in the radial direction) between the n⁺-type source region 9 and the n⁺-type drain region 6 of the nchMOSFET 104. The radial direction matches the direction in which the drift current flows (that is, the direction from the side of the high potential side region 101 to the side of the low potential side region 102). The high concentration region interval L1 of the nchMOSFET 104 is one factor that determines the drift length of the nchMOSFET 104. The high concentration region interval L2 of the parasitic diode 105 of the HVJT 103 is the interval between the cathode contact region (the n⁺-type pick-up region 7) and the anode contact region (the p⁺-type contact region 8) of the parasitic diode 105 of the HVJT 103. The high concentration region interval L2 of the parasitic diode 105 of the HVJT 103 is one factor that determines the drift length of the parasitic diode 105 of the HVJT 103.

A width w2 in a direction perpendicular to the longitudinal direction of the second FP 32 may be, for example, uniform for the overall periphery of the second FP 32 on the interlayer insulating film 14. A width w3 in a direction perpendicular to the circumferential direction of the third FP 33 may be, for example, uniform for the overall periphery of the third FP 33 on the interlayer insulating film 14. The intervals each between the FPs on the interlayer insulating film 14 only have to satisfy "x1>x2" as above, and the distances each from the low potential side FP to the high potential side FP (the intervals x2 and x3) on the interlayer insulating film 14 may be equal to each other in the longitudinal direction in the portion exclusive of the MOS region 21a of the first HVJT portion 21 (x1>x2 and x2=x3).

Figure 1B:
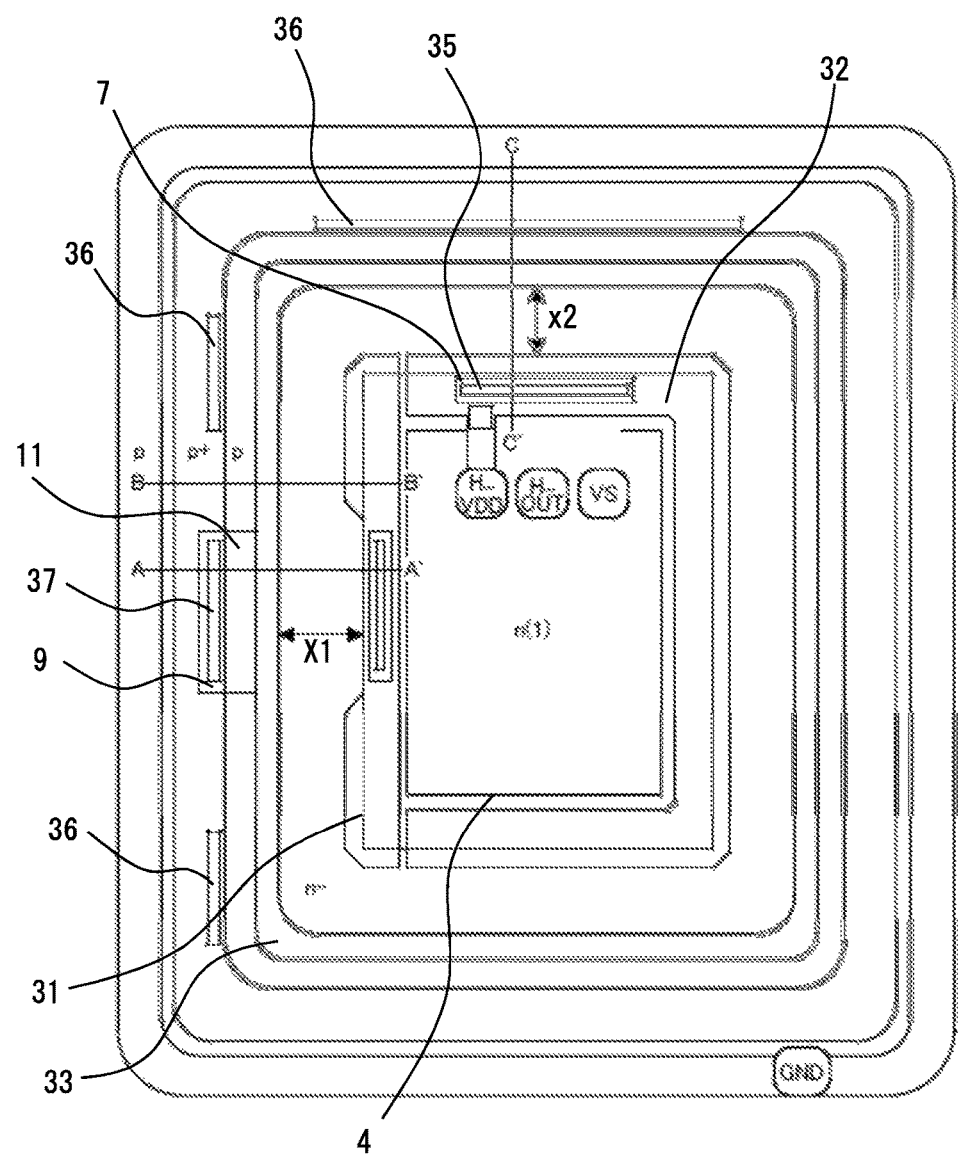
FIG. 1B is a plan diagram of a planar layout of a semiconductor device according to a modification of the first embodiment.
Figure 2B:
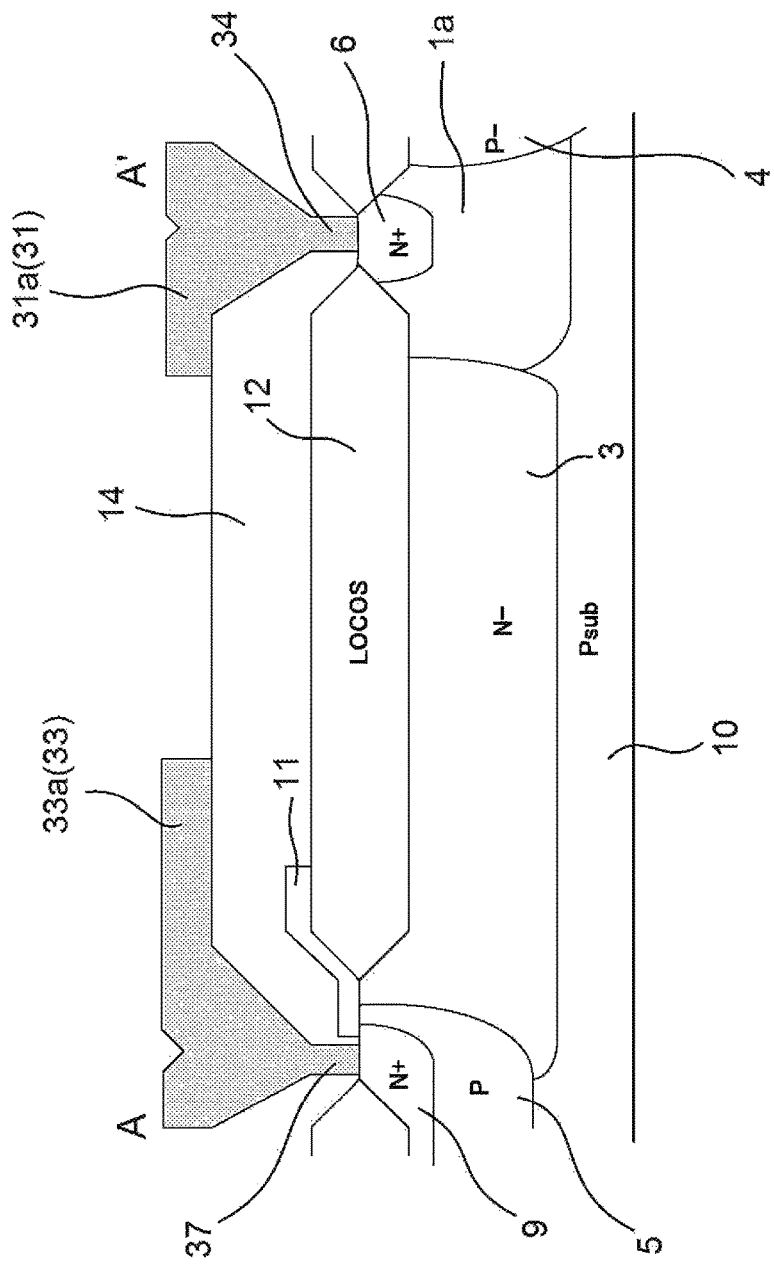
FIG. 2B is a cross-sectional view taken along a cutting line A-A' in FIG. 1B.
Figure 3B:
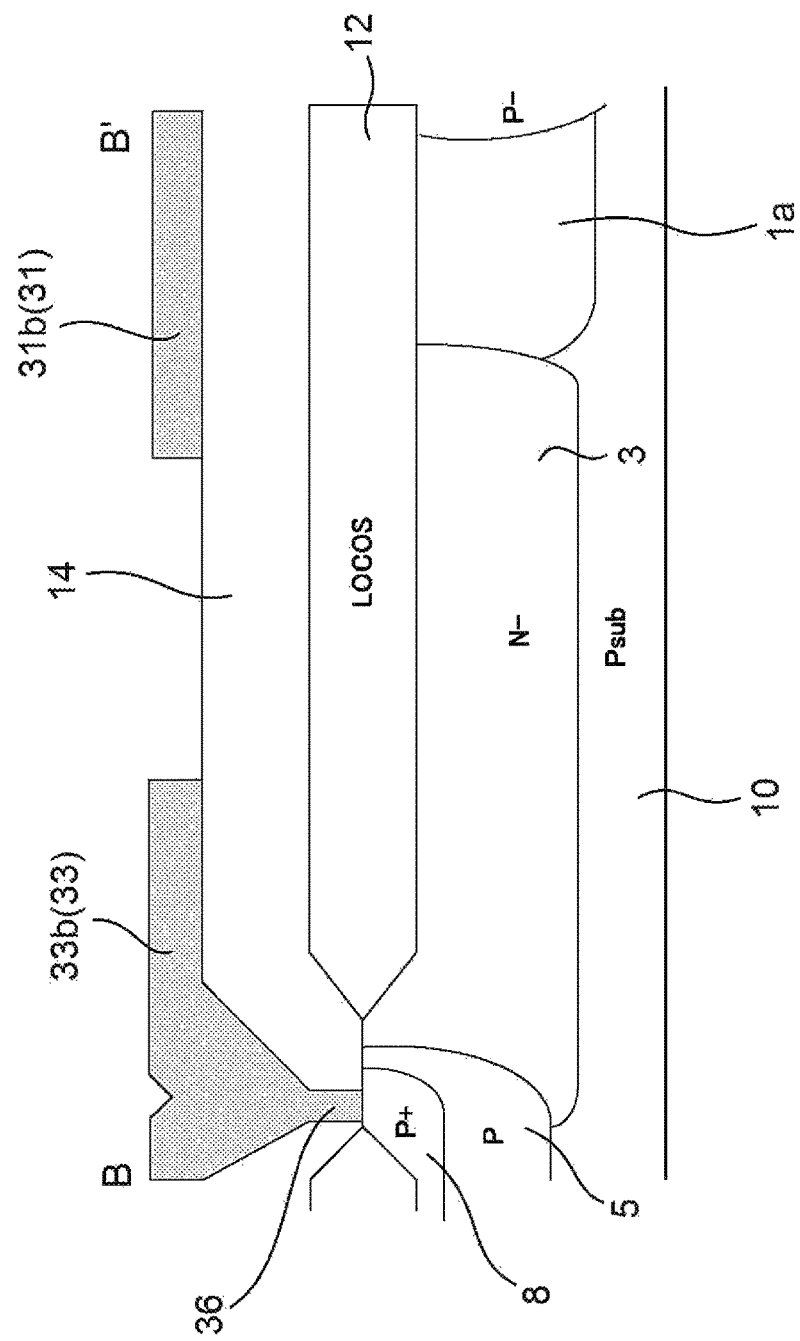
FIG. 3B is a cross-sectional view taken along a cutting line B-B' in FIG. 1B.
Figure 4A:
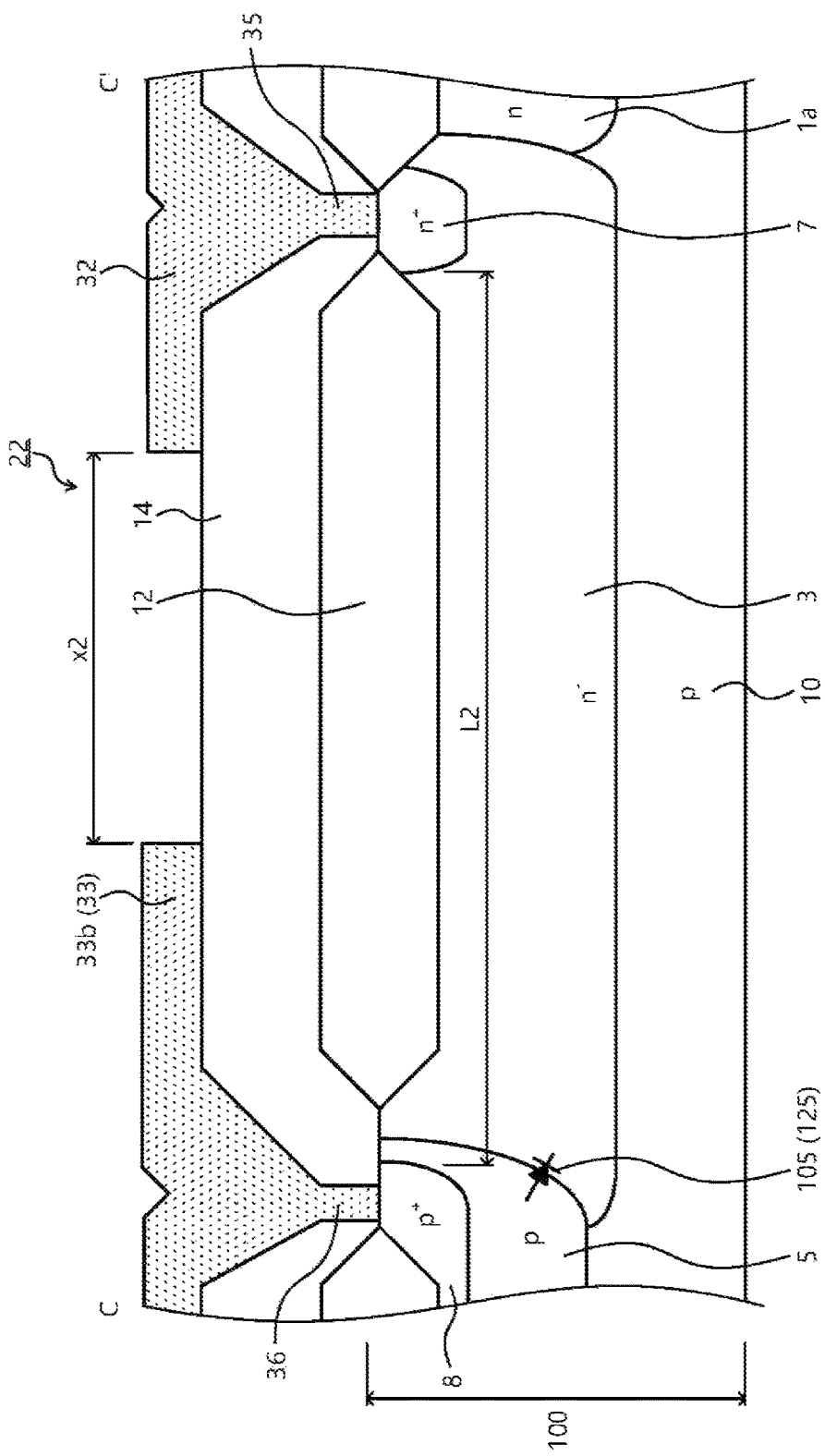
FIG. 4A is a cross-sectional view taken along a cutting line C-C' in FIG. 1A.
Figure 4B:
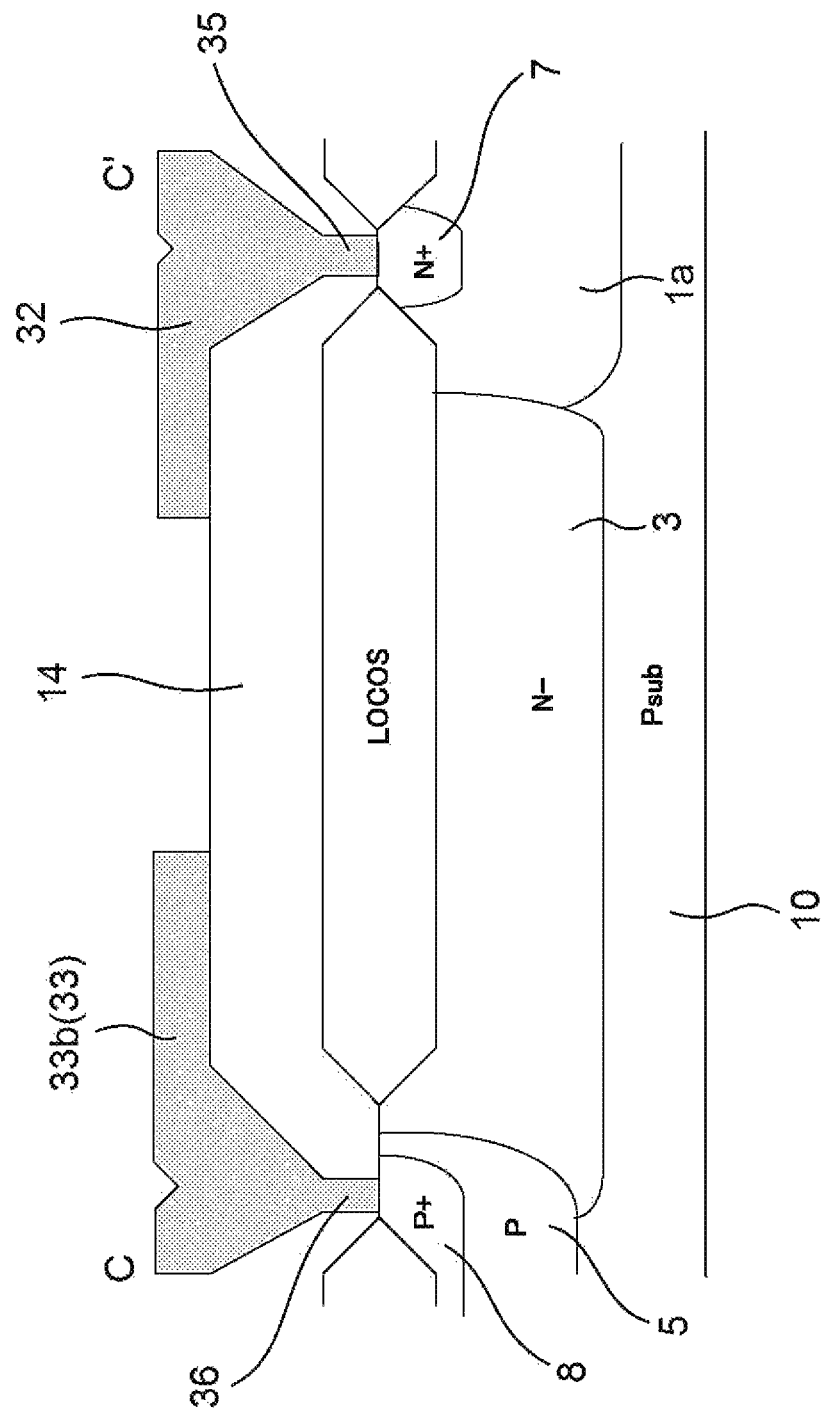
FIG. 4B is a cross-sectional view taken along a cutting line C-C' in FIG. 1B.

FIG. 1B is a plan diagram of a planar layout of a semiconductor device according to a modification of the first embodiment. FIGS. 2B, 3B and 4B are cross-sectional views corresponding to FIG. 1B. As shown in FIGS. 1B, 2B, 3B and 4B, the n⁺-type drain region 6 and the n⁺-type pick-up region 7 can be formed in the n-type diffusion region 1a.

The cross-sectional structure of the HVJT 103 will be described. FIG. 2A is a cross-sectional view taken along a cutting line A-A' in FIG. 1A. FIG. 3A is a cross-sectional view taken along a cutting line B-B' in FIG. 1A. FIG. 4A is a cross-sectional view taken along a cutting line C-C' in FIG. 1A. FIG. 2B is a cross-sectional view taken along a cutting line A-A' in FIG. 1B. FIG. 3B is a cross-sectional view taken along a cutting line B-B' in FIG. 1B. FIG. 4B is a cross-sectional view taken along a cutting line C-C' in FIG. 1B.

For example, FIG. 2A depicts a cross-sectional view of the MOS region 21a of the first HVJT portion 21. FIG. 3A depicts a cross-sectional view of the portion other than the MOS region 21a of the first HVJT portion 21. FIG. 4A depicts a cross-sectional view of the second HVJT portion 22. FIG. 2A depicts a cross-sectional view of the nchMOSFET 104 and FIGS. 3A and 4A each depict a cross-sectional view of the parasitic diode 105 of the HVJT 103.

As depicted in FIGS. 2A to 4A, the n-type diffusion region 1a, the p-type substrate region 2 (see FIG. 1A), the n⁻-type diffusion region 3, and the first and the second p-type separation regions 4 and 5 are each selectively provided in the surface layer of the front surface of the p-type semiconductor substrate 100. Excluding the portions to be contacts 34 to 37 in contact with the first to the third FPs 31 to 33, the front surface of the p-type semiconductor substrate 100 is covered with a local oxidation of silicon (LOCOS) film 12 and the interlayer insulating film 14. The p-type substrate region 2 to be the low potential side region 102 is arranged farther outward than the n⁻-type diffusion region 3. The depth of the p-type substrate region 2 is, for example, equal to or larger than the depth of the n⁻-type diffusion region 3.

The n⁻-type diffusion region 3 is arranged farther outward than the n-type diffusion region 1a that is the high potential side region 101. The depth of the n⁻-type diffusion region 3 may be, for example, equal to the depth of the n-type diffusion region 1a. The n⁻-type diffusion region 3 and the p-type region 10 on the rear surface side of the substrate constitute a single reduced surface field (RESURF) structure. The p-type region 10 on the rear surface side of the substrate is the portion that remains in a portion deeper than the n-type diffusion region 1a and the n⁻-type diffusion region 3 from the front surface of the substrate, and that remains therein as a p-type region because these regions are not formed therein.

The n⁺-type drain region 6 (FIG. 2A) and the n⁺-type pick-up region 7 of the nchMOSFET 104 are each selectively provided away from each other on the high potential side in the surface layer on the substrate front side of the n⁻-type diffusion region 3 or the n-type diffusion region 1a (FIG. 4A). The n⁺-type drain region 6 is provided in the MOS region 21a of the first HVJT portion 21, and the n⁺-type pick-up region 7 is provided in the second HVJT portion 22. A p-type diffusion region not depicted and forming a double RESURF structure may be provided in the surface layer on the substrate front surface side of the n⁻-type diffusion region 3. In this case, the n⁺-type drain region 6 and the n⁺-type pick-up region 7 are arranged away from the p-type diffusion region forming the double RESURF structure and are farther on the high potential side than the p-type diffusion region.

The first p-type separation region 4 is provided, for example, between the n-type diffusion region 1a and the n⁻-type diffusion region 3 in the first HVJT portion 21. The first p-type separation region 4 is provided at a depth reaching the p-type region 10 on the rear surface side of the substrate. The depth of the first p-type separation region 4 may be, for example, equal to the depth of the n⁻-type diffusion region 3. The first p-type separation region 4 may be a portion of the p-type semiconductor substrate 100 remaining in a slit shape to be exposed at the front surface of the substrate from the p-type region 10 on the rear surface side of the substrate. To be exposed at the front surface of the substrate refers to being arranged to be in contact with the LOCOS film 12.

The second p-type separation region 5 is arranged farther outward than the n⁻-type diffusion region 3. The second p-type separation region 5 is provided at a depth reaching the p-type region 10 on the rear surface side of the substrate. The depth of the second p-type separation region 5 may be, for example, shallower than the depth of the n⁻-type diffusion region 3. In the second p-type separation region 5, the p⁺-type contact region 8 is selectively provided spanning from the first HVJT portion 21 to the second HVJT portion 22 (FIGS. 3 and 4). In the second p-type separation region 5, the n⁺-type source region 9 is selectively provided of the nchMOSFET 104 in the MOS region 21a of the first HVJT portion 21 (FIG. 2A).

As depicted in FIG. 2A, the planar gate horizontal nchMOSFET 104 is provided in the MOS region 21a of the first HVJT portion 21. In the MOS region 21a of the first HVJT portion 21, a parasitic npn-transistor 106 is produced that includes the n⁻-type diffusion region 3, the second p-type separation region 5, and the n⁺-type source region 9. The n⁺-type source region 9 and the n⁺-type drain region 6 of the nchMOSFET 104 face each other sandwiching the n⁻-type diffusion region 3 therebetween. The gate electrode 11 of the nchMOSFET 104 is provided through a gate insulating film 13 on the surface of a portion of the second p-type separation region 5 sandwiched by the n⁻-type diffusion region 3 and the n⁺-type source region 9. The gate electrode 11 may extend on the LOCOS film 12 that covers the n⁻-type diffusion region 3 between the gate electrode 11 and the n⁺-type drain region 6.

The fourth portion 31a of the first FP 31 is in contact with the n⁺-type drain region 6 through the contact 34. The fourth portion 31a of the first FP 31 extends toward the low potential side on the interlayer insulating film 14. The first portion 33a of the third FP 33 is in contact with the n⁺-type source region 9 through the contact 37 and is electrically insulated from the gate electrode 11 of the nchMOSFET 104 by the interlayer insulating film 14. The first portion 33a of the third FP 33 may be in contact with the p⁺-type contact region 8 in the MOS region 21a of the first HVJT portion 21. The first portion 33a of the third FP 33 extends toward the high potential side on the interlayer insulating film 14. The first portion 33a of the third FP 33 may extend toward the high potential side more than the gate electrode 11.

As depicted in FIG. 3A, in portions other than the MOS region 21a of the first HVJT portion 21, the n⁺-type source region 9 and the n⁺-type drain region 6 are not provided and the parasitic diode 105 is formed that uses the second p-type separation region 5 as an anode region and the n⁻-type diffusion region 3 as a cathode region. The first FP 31 extends on the interlayer insulating film 14 from the MOS region 21a in the longitudinal direction (the depth direction from the page surface of FIG. 3A). The portion of the first FP 31 extending from the MOS region 21a is the third portion 31b of the first FP 31. The second portion 33b of the third FP 33 extends from the MOS region 21a in the longitudinal direction.

The third FP 33 is in contact only with the p⁺-type contact region 8 in the second portion 33b exclusive of the MOS region 21a of the first HVJT portion 21, and is electrically connected to the second p-type separation region 5 through the p⁺-type contact region 8. The interval x3 between the first and the third FPs 31 and 33 in the portion exclusive of the MOS region 21a of the first HVJT portion 21 is smaller than the interval x1 between the first and the third FPs 31 and 33 in the MOS region 21a of the first HVJT portion 21. The third portion 31b of the first FP 31 overhangs toward the low potential side, the second portion 33b of the third FP 33 partially overhangs toward the high potential side, or these configurations may concurrently be established such that the interval x3 between the first and the third FPs 31 and 33 in the portion exclusive of the MOS region 21a of the first HVJT portion 21 becomes relatively small.

As depicted in FIG. 4A, the second HVJT portion 22 has the n⁺-type pick-up region 7 provided therein. The parasitic diode 105 is formed that uses the second p-type separation region 5 as an anode region and uses the n⁻-type diffusion region 3 as a cathode region. The second FP 32 is connected to the n⁺-type pick-up region 7 through the contact 35. The second FP 32 extends toward the low potential side on the interlayer insulating film 14. The third FP 33 extends from the first HVJT portion 21, is in contact only with the p⁺-type contact region 8, and is electrically connected to the second p-type separation region 5 through the p⁺-type contact region 8.

On the interlayer insulating film 14, the interval x2 between the second and the third FPs 32 and 33 in the portion exclusive of the MOS region 21a of the first HVJT portion 21 and the second HVJT portion 22 is smaller than the interval x1 between the first and the third FPs 31 and 33 in the MOS region 21a of the first HVJT portion 21. For example, the second FP 32 overhangs toward the low potential side, the second portion 33b of the third FP 33 partially overhangs toward the high potential side, or these configurations may concurrently be established such that the interval x2 between the second and the third FPs 32 and 33 in the portion exclusive of the MOS region 21a of the first HVJT portion 21 and the second HVJT portion 22 becomes relatively small on the interlayer insulating film 14. The cross-sectional structure of the portion of the first HVJT portion 21 and having the second FP 32 extending therein is same as the cross-sectional structure formed by substituting the reference numeral "31b" of FIG. 3A with the reference numeral "32".

As above, according to the first embodiment, the electric field applied to the drift region of the level shifter (for example, the nchMOSFET) may be alleviated and the OFF breakdown voltage of the level shifter may be increased to be higher than the OFF breakdown voltage of the parasitic diode of the region exclusive of the level shifter of the HVJT, by configuring the interval between the FPs of the level shifter to be larger than the interval between the FPs of the parasitic diode of the region exclusive of the level shifter of the HVJT. When a surge such as an ESD is input into the H-VDD pad during an OFF time period, the avalanche current passes mainly through the portions in which no operation of any parasitic npn-transistor is caused (the portion exclusive of the MOS region of the first HVJT portion and the second HVJT portion) to flow in the GND pad. Flow of the avalanche current in the level shifter resulting in the breakdown with the operation of the parasitic npn-transistor due to the avalanche current as the trigger thereof may be suppressed. Avalanche breakdown of the level shifter may thereby be suppressed and the surge capability of the overall semiconductor device may therefore be improved. This effect is useful especially for an HBM-model memory.

According to the first embodiment, adverse effects on electric properties such as the signal transmission are weak compared to a case where avalanche current is limited by setting the level-shift resistance to be high or the device size of the level shifter is increased, like a traditional structure.

The chip area is not increased because the balance of the turn OFF capability (OFF breakdown voltage difference) between the parasitic diode of the region exclusive of the level shifter of the HVJT and the level shifter may be adjusted by adjusting the dimensions of the FPs (the overhang width). Increase of the chip area may therefore be suppressed to a maximal extent and the surge capability may be improved in an HVIC that includes an HVJT and a level shifter on a single semiconductor chip.

Figure 5:
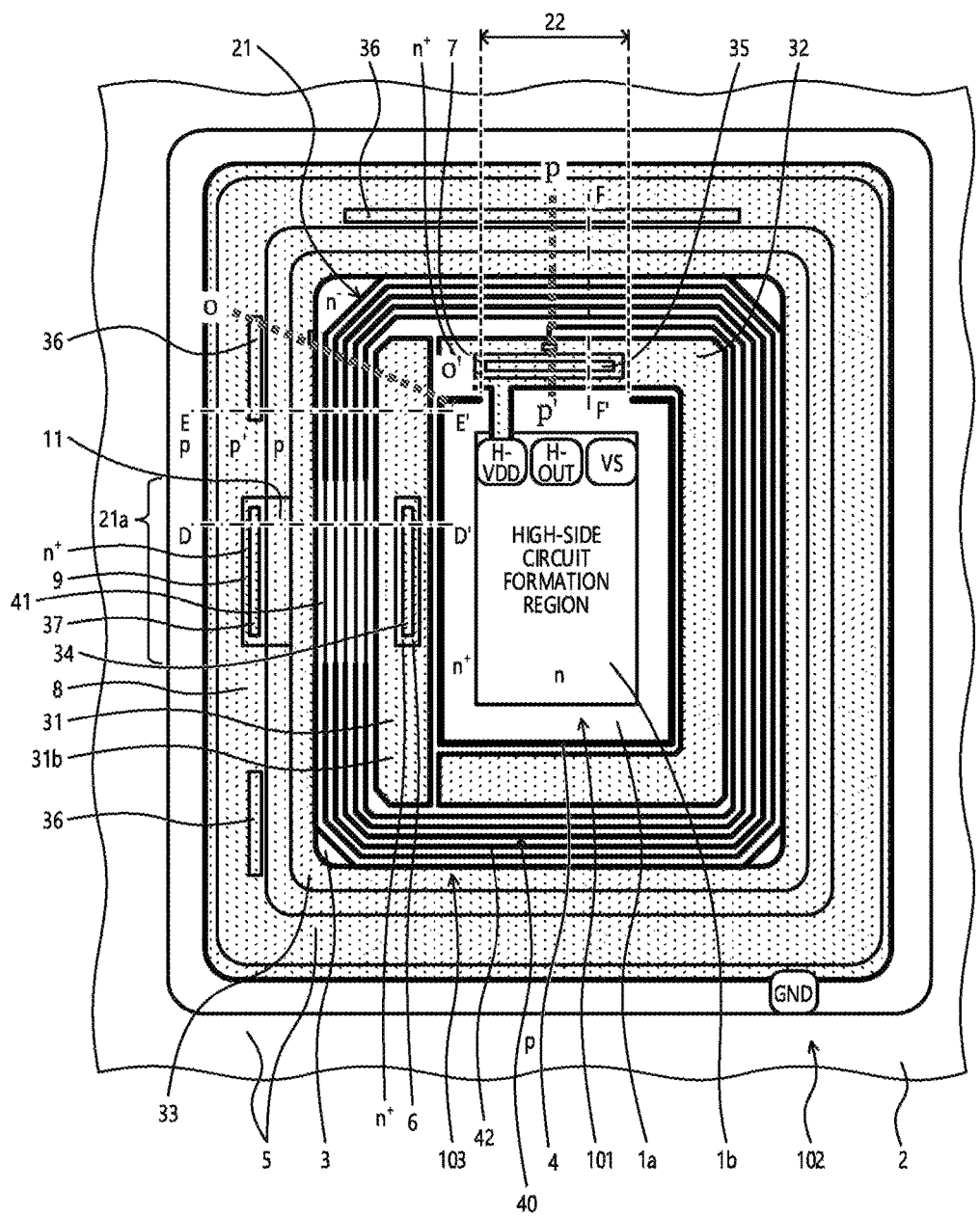
FIG. 5 is a plan diagram of a planar layout of a semiconductor device according to a second embodiment.
Figure 6:
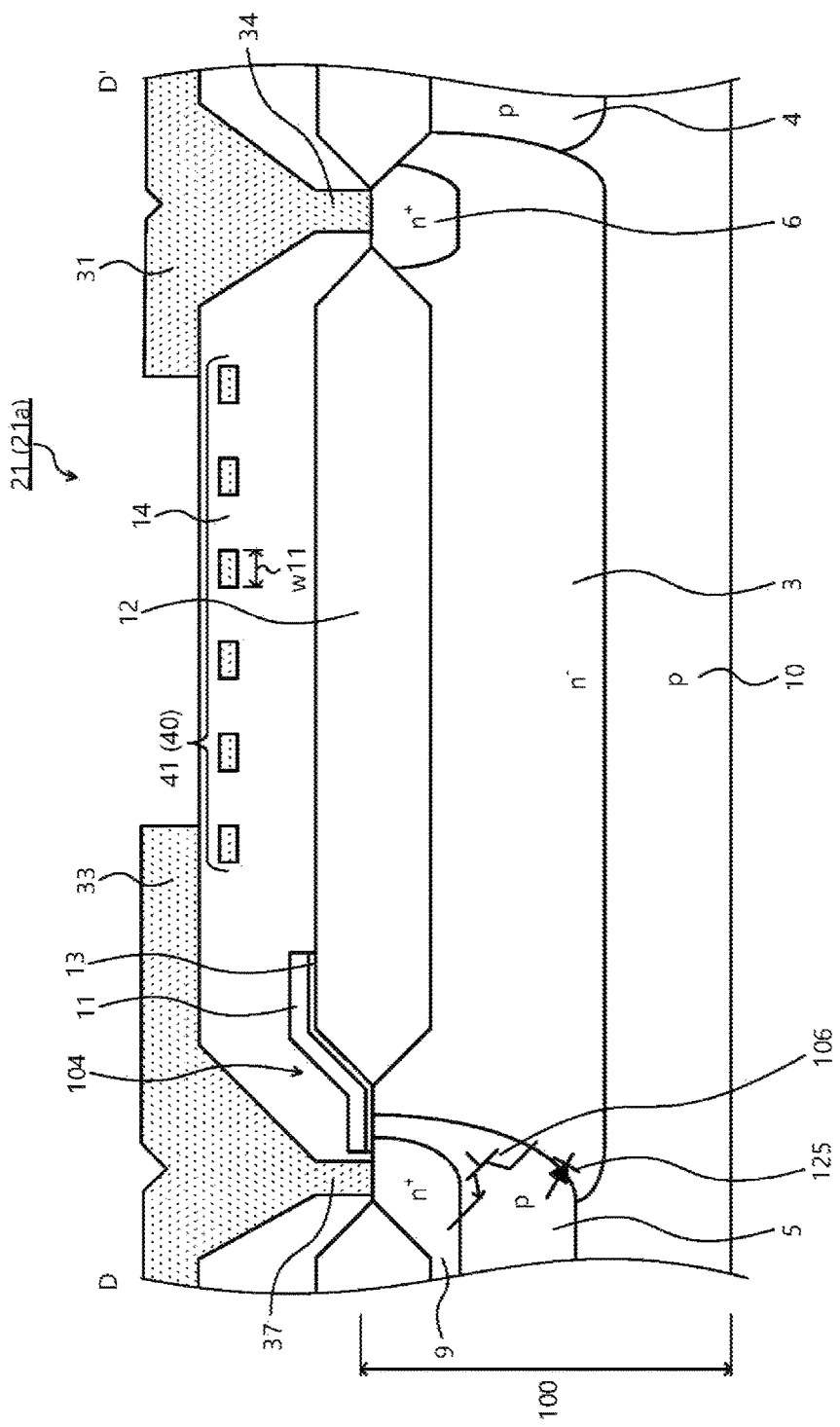
FIG. 6 is a cross-sectional view taken along a cutting line D-D' in FIG. 5.
Figure 7A:
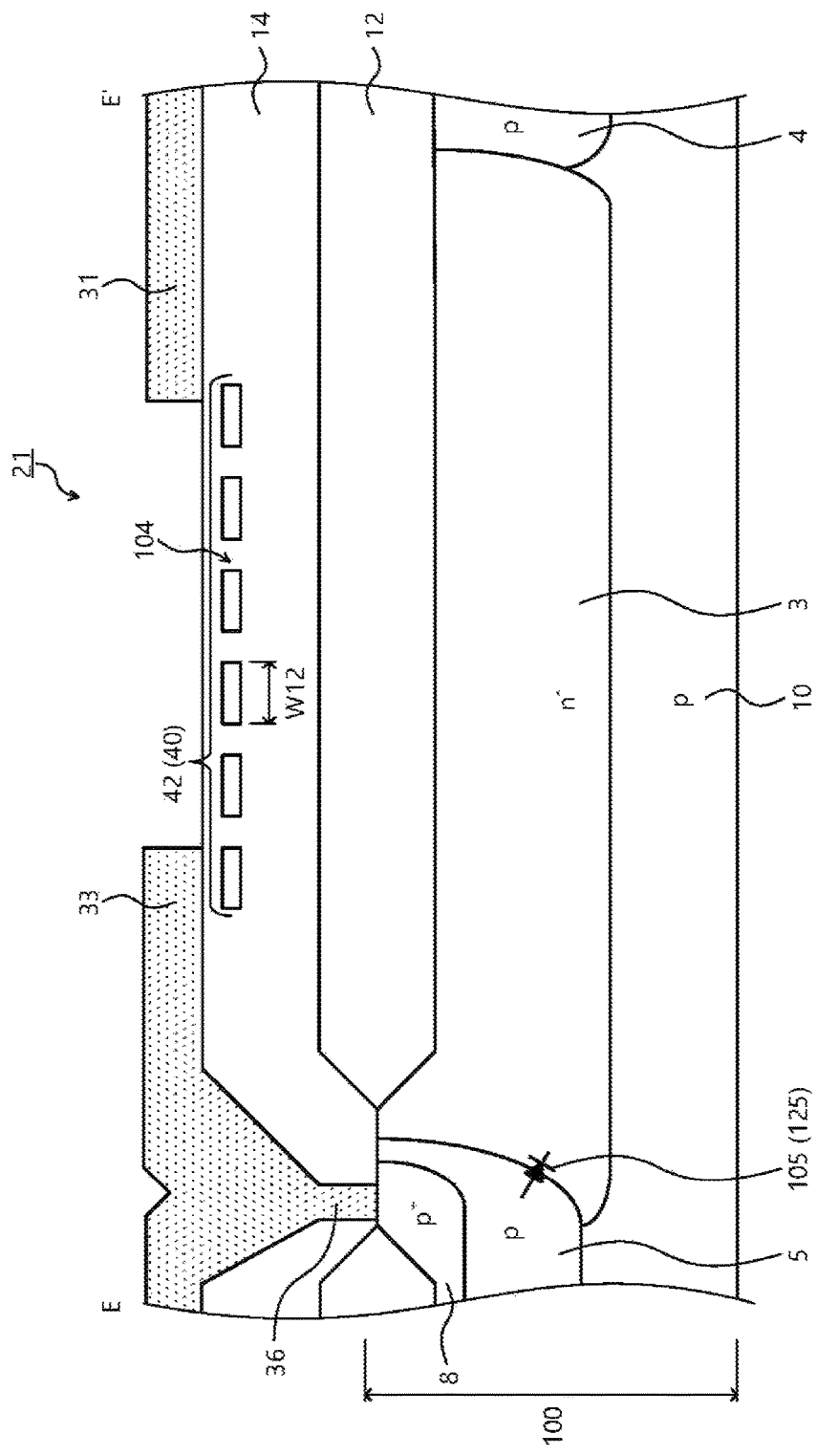
FIG. 7A is a cross-sectional view taken along a cutting line E-E' in FIG. 5.
Figure 7B:
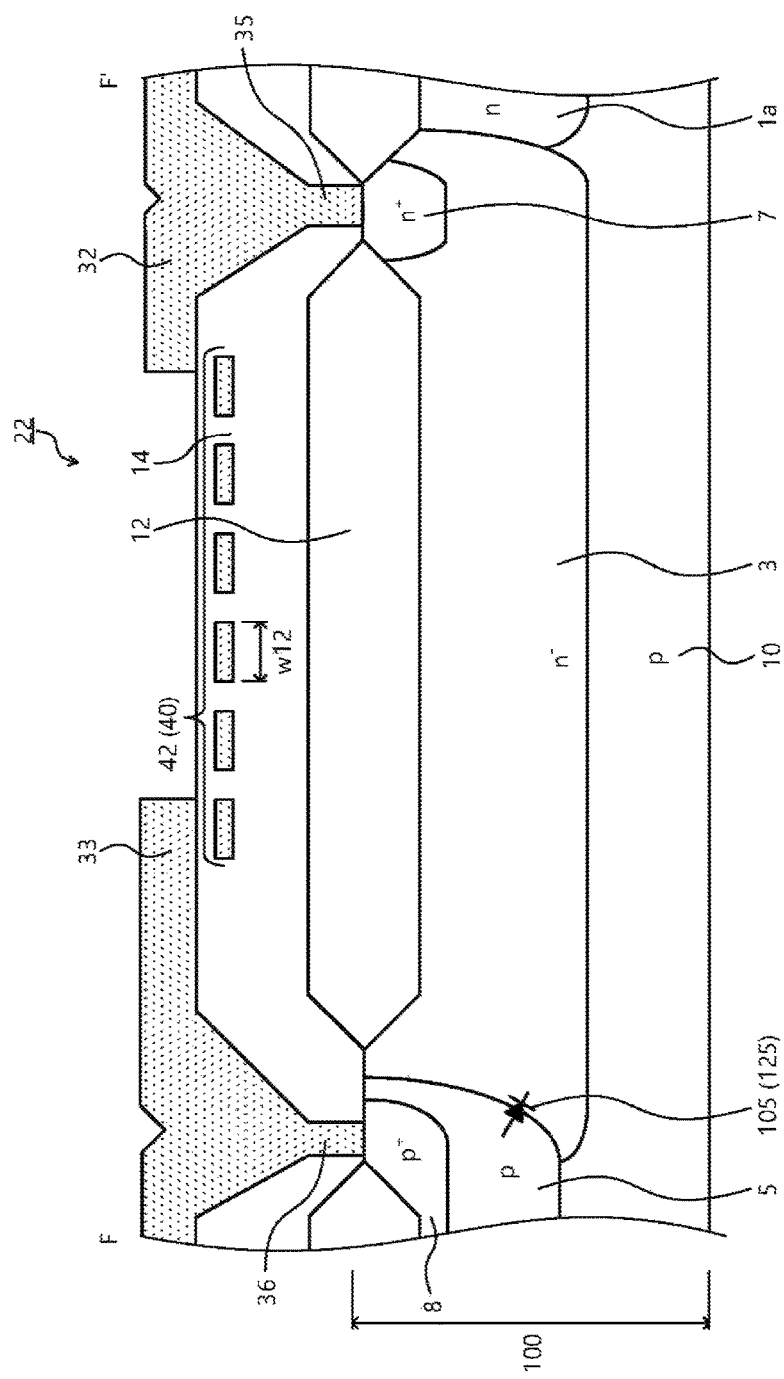
FIG. 7B is a cross-sectional view taken along a cutting line F-F' in FIG. 5.
Figure 8A:
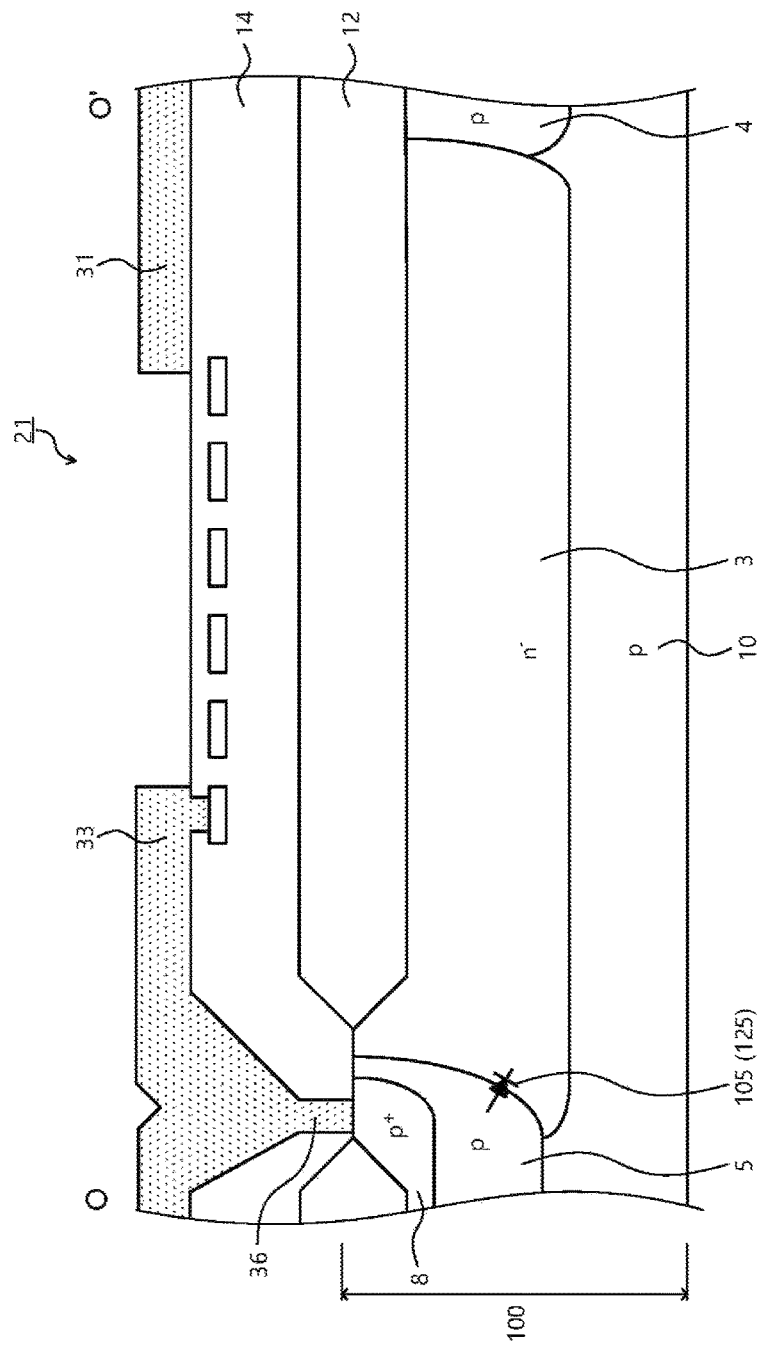
FIG. 8A is a cross-sectional view taken along a cutting line O-O' in FIG. 5.

A configuration of a semiconductor device according to a second embodiment will be described. FIG. 5 is a plan diagram of a planar layout of the semiconductor device according to the second embodiment. FIG. 6 is a cross-sectional view taken along a cutting line D-D' in FIG. 5. FIG. 7A is a cross-sectional view taken along a cutting line E-E' in FIG. 5. FIG. 7B is a cross-sectional view taken along a cutting line F-F' in FIG. 5. FIG. 8A is a cross-sectional view taken along a cutting line O-O' in FIG. 5. FIG. 8B is a cross-sectional view taken along a cutting line P-P' in FIG. 5.

The semiconductor device according to the second embodiment differs from the semiconductor device according to the first embodiment in that a resistive field plate (a fourth electrode) 40 is included between the first and the second FPs 31 and 32, and the third FP 33.

For example, the resistive field plate 40 is provided in the interlayer insulating film 14 that covers the n⁻-type diffusion region 3, and is electrically insulated from the first to the third FPs 31 to 33 and the gate electrode 11 of the nch-MOSFET 104 by the interlayer insulating film 14. The resistive field plate 40 is arranged, for example, more inwardly than the gate electrode 11 of the nchMOSFET 104. The resistive field plate 40 is, for example, a thin film resistive layer that is arranged in a spiral planar layout surrounding the periphery of the high potential side region 101 to reach the side of the low potential side region 102 (the outer peripheral side) from the side of the high potential side region 101 (the inner peripheral side) and that includes a resistive material such as polysilicon (poly-Si).

As to the resistive field plate 40, a high potential side end thereof is connected to the second FP 32 and a low potential side end thereof is connected to the third FP 33 at portions not depicted. A spiral wire on the innermost peripheral side of the resistive field plate 40 may be arranged to face the first and the second FPs 31 and 32 in the depth direction. The spiral wire on the outermost peripheral side of the resistive field plate 40 may be arranged to face the third FP 33 in the depth direction. Similar to the first to the third FPs 31 to 33, the resistive field plate 40 has a function of equalizing the surface potential distribution of the HVJT 103. The intervals between the first and the second FPs 31 and 32, and the third FP 33 may be, for example, equal to each other in the longitudinal direction.

As to the resistive field plate 40, a width w11 of the spiral wire of a portion 41 thereof positioned in the MOS region 21a of the first HVJT portion 21 is configured to be smaller than a width w12 of the spiral wire in another portion 42 thereof (w11<w12). The surface electric field of an edge termination structure is thereby alleviated in the portion 41 positioned in the MOS region 21a of the first HVJT portion 21 and the breakdown voltage thereof may be configured to be relatively higher than that of the HVJT 103. The portion 41 positioned in the MOS region 21a of the first HVJT portion 21 is the portion positioned between the n⁺-type drain region 6 and the n⁺-type source region 9. The region whose width w11 of the spiral wire is configured to be smaller than that of the other portion 42 (the range of the portion 41 positioned in the MOS region 21a of the first HVJT portion 21) is arranged to be positioned in a region to at least face the n⁺-type source region 9 in the direction for a drift current to flow therethrough. FIG. 5 depicts the portion 41 of the resistive field plate 40 positioned in the MOS region 21a of the first HVJT portion 21 using a line thinner than that for the other portion 42. Similar to the first embodiment, the balance of the turn OFF capability between the parasitic diode 105 of the HVJT 103 and the level shifter may be adjusted by adjusting the widths w11 and w12 of the spiral wires of the resistive field plate 40.

As above, according to the second embodiment, effects identical to those of the first embodiment may be achieved by using the resistive field plate.

Figure 9:
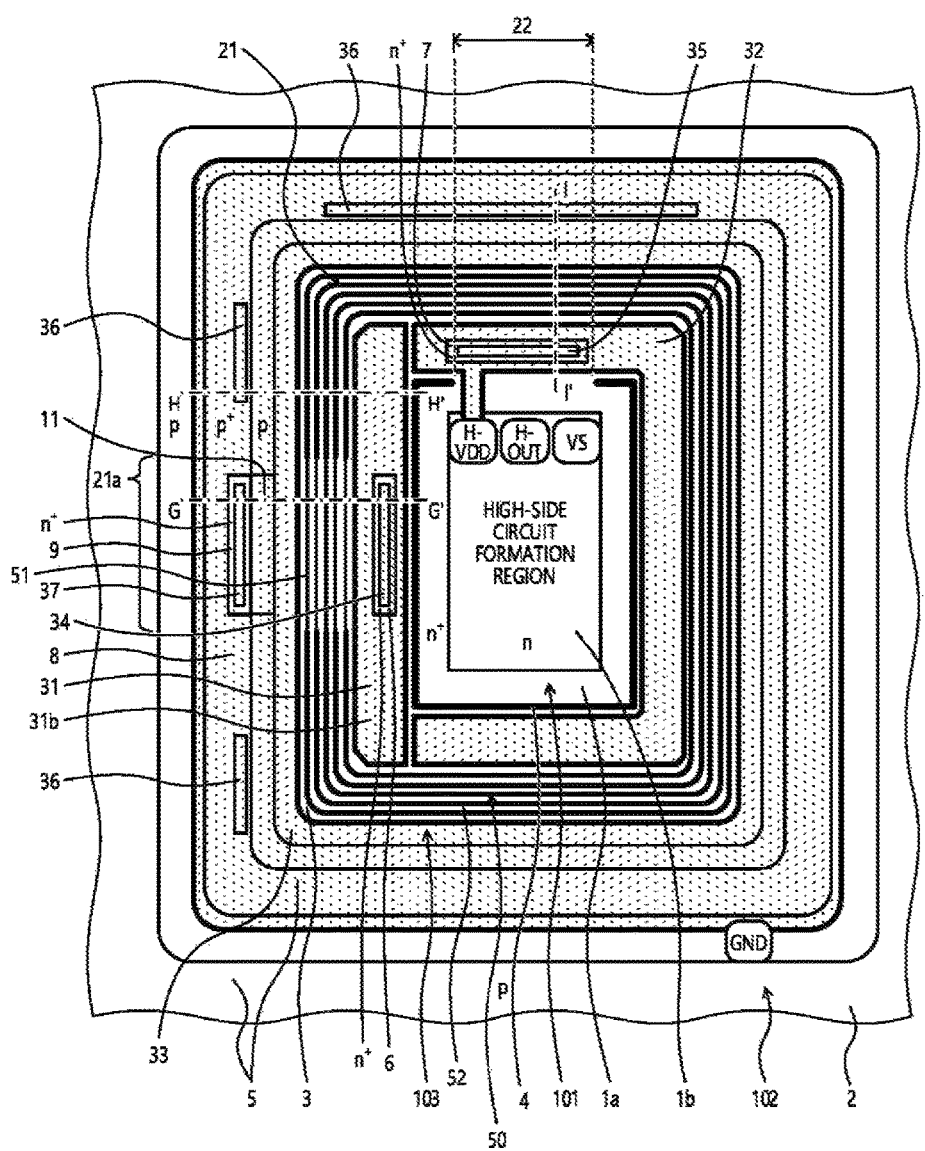
FIG. 9 is a plan diagram of a planar layout of a semiconductor device according to a third embodiment.
Figure 10:
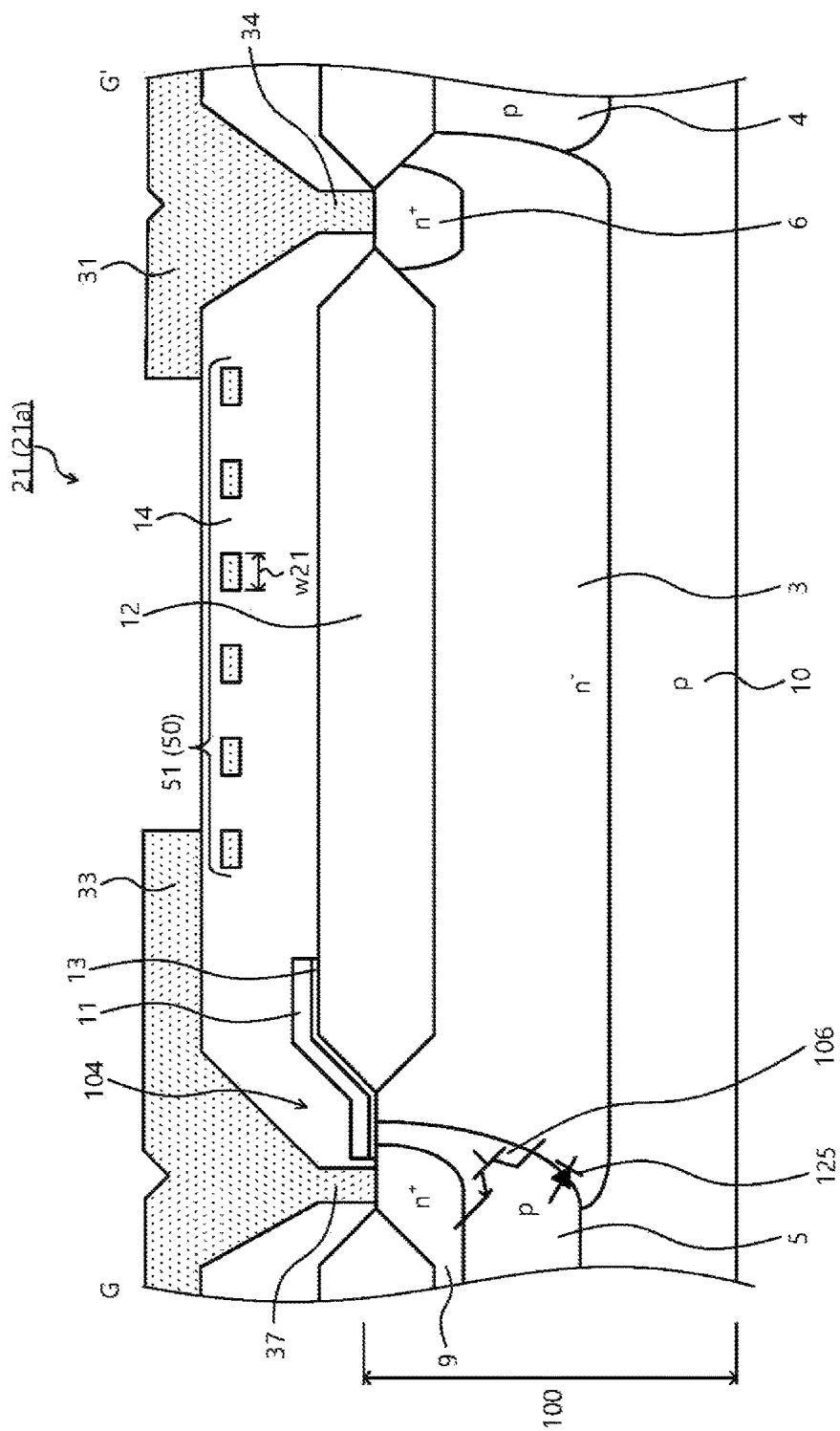
FIG. 10 is a cross-sectional view taken along a cutting line G-G' in FIG. 9.
Figure 11:
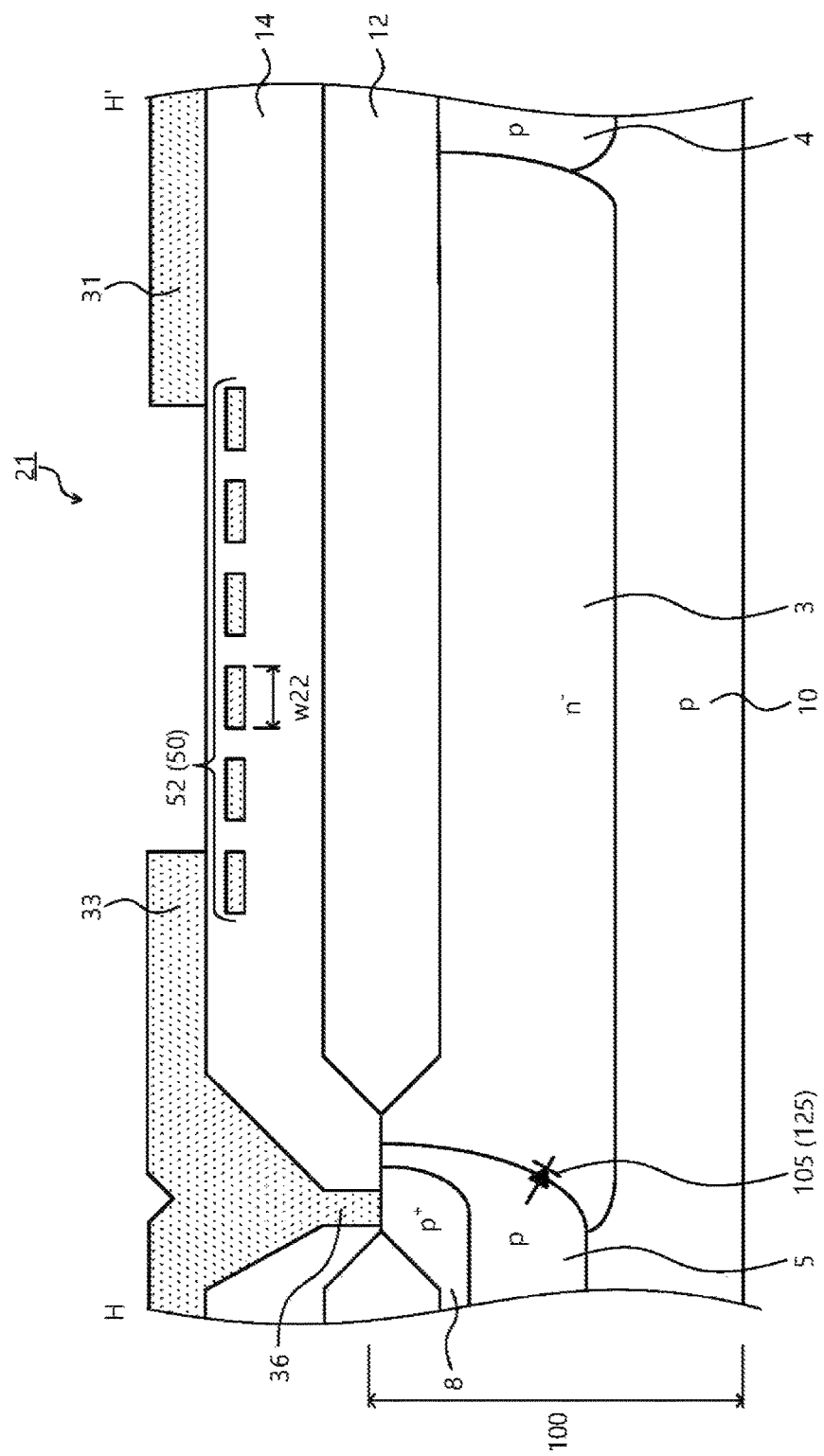
FIG. 11 is a cross-sectional view taken along a cutting line H-H' in FIG. 9.
Figure 12:
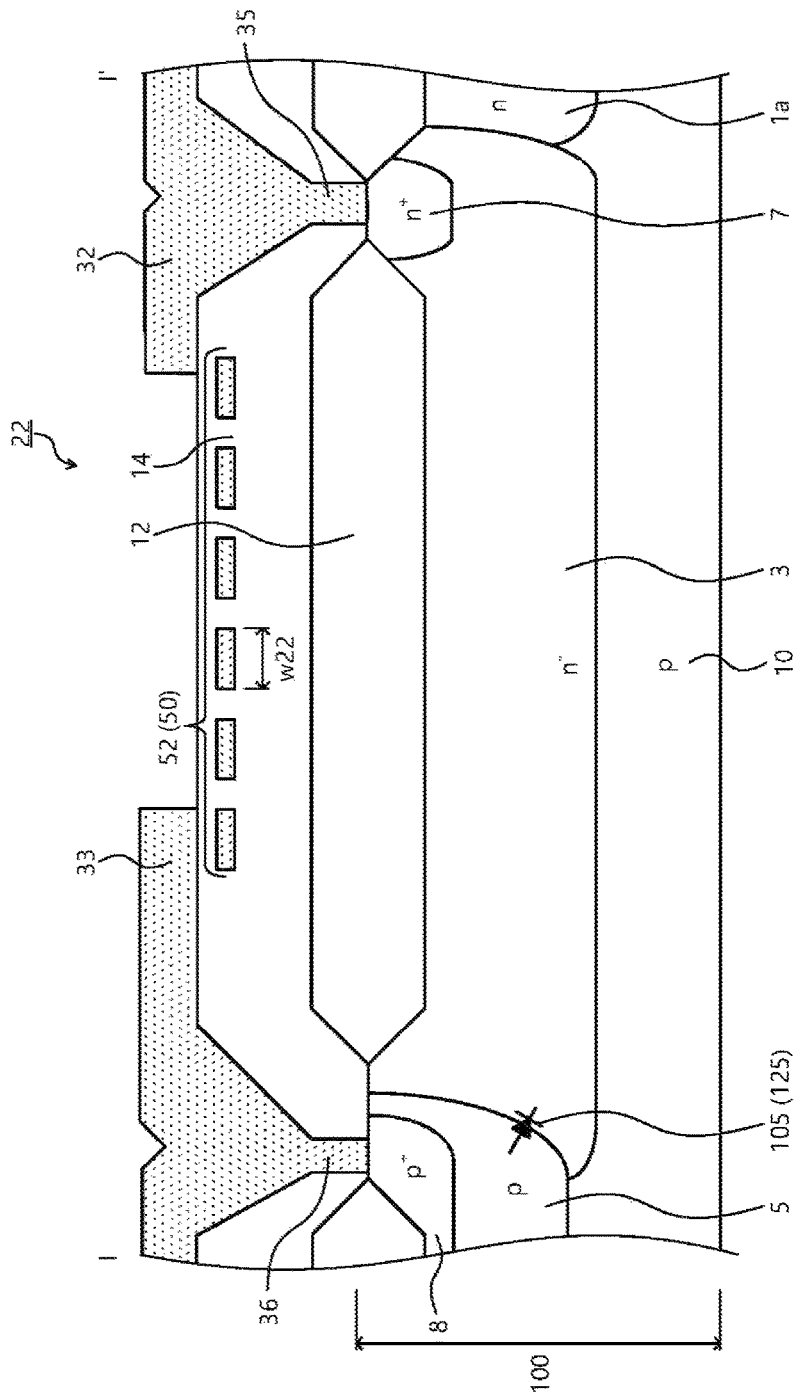
FIG. 12 is a cross-sectional view taken along a cutting line I-I' in FIG. 9.

A configuration of a semiconductor device according to a third embodiment will be described. FIG. 9 is a plan diagram of a planar layout of the semiconductor device according to the third embodiment. FIG. 10 is a cross-sectional view taken along a cutting line G-G' in FIG. 9. FIG. 11 is a cross-sectional view taken along a cutting line H-H' in FIG. 9. FIG. 12 is a cross-sectional view taken along a cutting line I-I' in FIG. 9. The semiconductor device according to the third embodiment differs from the semiconductor device according to the first embodiment in that a capacitance coupled field plate (a fourth electrode) 50 is included between the first and the second FPs 31 and 32, and the third FP 33.

For example, the capacitance coupled field plate 50 is provided in the interlayer insulating film 14 that covers the n⁻-type diffusion region 3, and is electrically insulated from the first to the third FPs 31 to 33 and the gate electrode 11 of the nchMOSFET 104 by the interlayer insulating film 14. The capacitance coupled field plate 50 is arranged, for example, more inwardly than the gate electrode 11 of the nchMOSFET 104. The capacitance coupled field plate 50 includes, for example, plural conductor layers that are arranged in concentric circular layouts surrounding the periphery of the high potential side region 101 and away from each other. The conductor layers are formed using a conductive material such as, for example, polysilicon and the adjacent conductor layers are capacitively coupled with each other sandwiching the interlayer insulating film 14 therebetween.

The conductor layer on the innermost peripheral side of the capacitance coupled field plate 50 is connected to the second FP 32 at a portion thereof not depicted, and the conductor layer on the outermost peripheral side thereof is connected to the third FP 33 in another portion thereof not depicted. The conductor layer on the innermost peripheral side of the capacitance coupled field plate 50 may be arranged to face the first and the second FPs 31 and 32 in the depth direction. The conductor layer on the outermost peripheral side of the capacitance coupled field plate 50 may be arranged to face the third FP 33 in the depth direction. Similar to the first to the third FPs 31 to 33, the capacitance coupled field plate 50 has a function of equalizing the surface potential distribution of the HVJT 103. The intervals between the first and the second FPs 31 and 32, and the third FP 33 may be, for example, equal to each other in the longitudinal direction.

As to the capacitance coupled field plate 50, a width w21 of the conductor layer of a portion 51 thereof positioned in the MOS region 21a of the first HVJT portion 21 is configured to be smaller than a width w22 of the conductor layer in another portion 52 thereof (w21<w22). The surface electric field of an edge termination structure is thereby alleviated in the portion 51 positioned in the MOS region 21a of the first HVJT portion 21 and the breakdown voltage thereof may be configured to be relatively higher than that of the HVJT 103. The capacitance coupled field plate 50 has a capacitance at the portion 51 positioned in the MOS region 21a of the first HVJT portion 21 that is relatively lower. The portion 51 positioned in the MOS region 21a of the first HVJT portion 21 is the portion positioned between the $n^+$-type drain region 6 and the $n^+$-type source region 9. The region whose width w21 of the conductor layer is configured to be smaller than that of the other portion 52 (the range of the portion 51 positioned in the MOS region 21a of the first HVJT portion 21) is arranged to be positioned in a region to at least face the $n^+$-type source region 9 in the direction for a drift current to flow therethrough. FIG. 9 depicts the portion 51 of the capacitance coupled field plate 50 positioned in the MOS region 21a of the first HVJT portion 21 using a line thinner than that for the other portion 52. Similar to the first embodiment, the balance of the turn OFF capability between the parasitic diode 105 of the HVJT 103 and the level shifter may be adjusted by adjusting the widths w21 and w22 of the conductor layers of the capacitance coupled field plate 50.

As above, according to the third embodiment, effects identical to those of the first and second embodiments may be achieved by using the capacitance coupled field plate 50.

Figure 13:
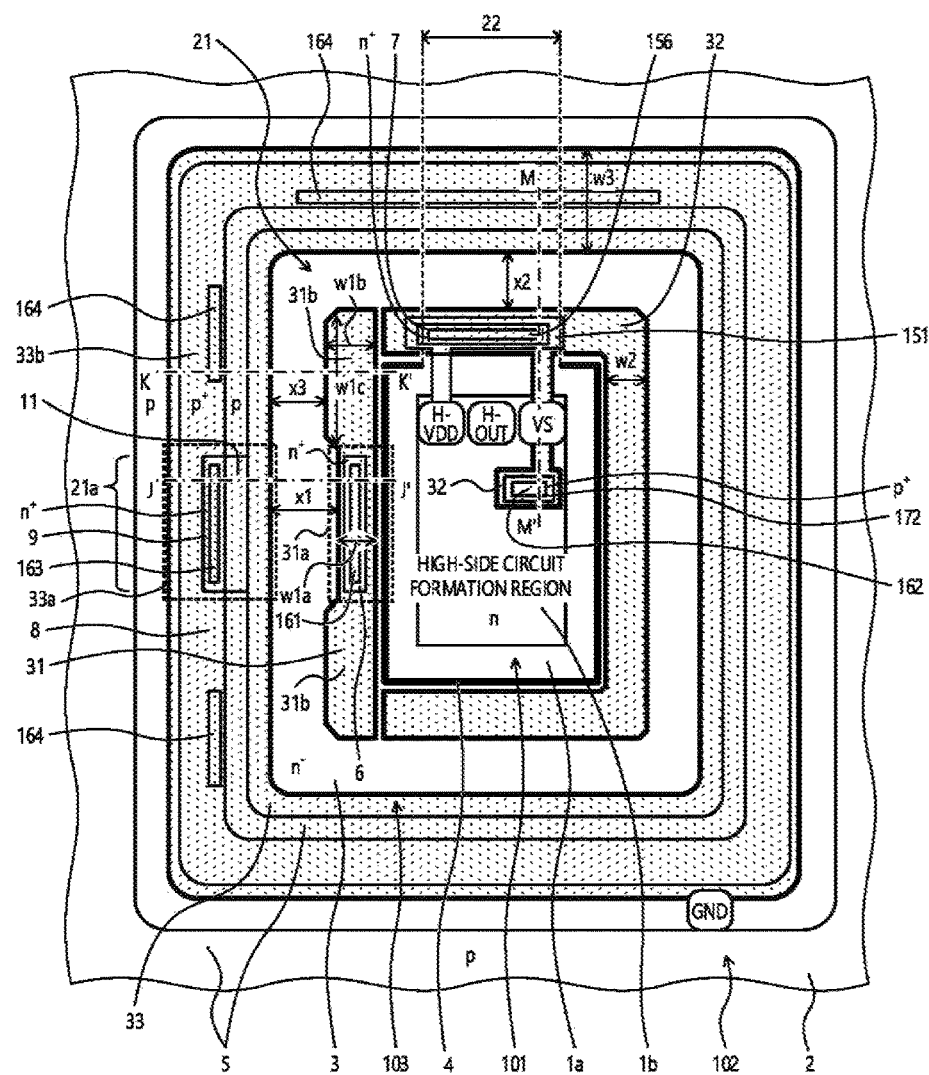
FIG. 13 is a plan diagram of a planar layout of a semiconductor device according to a fourth embodiment.
Figure 14:
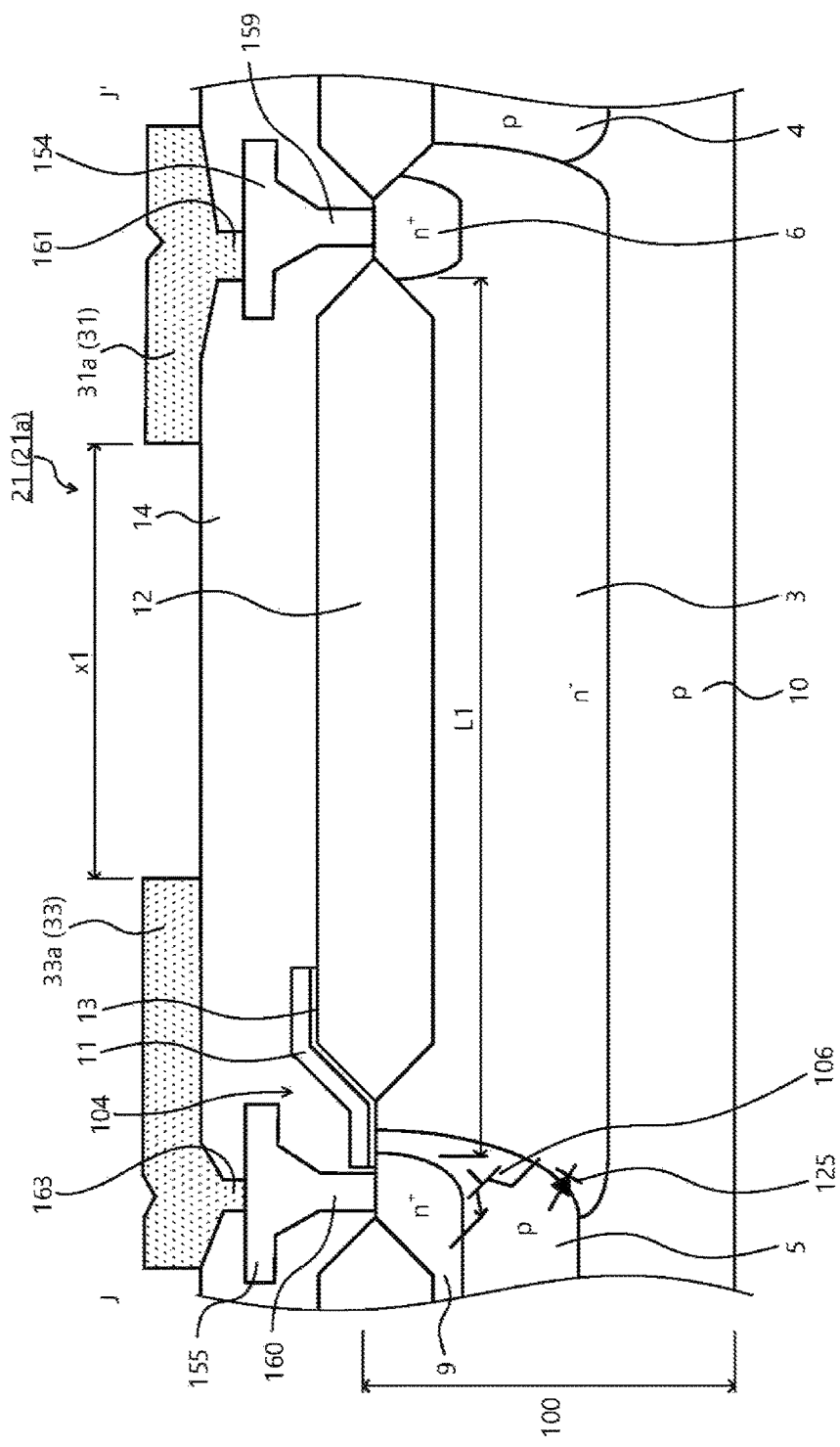
FIG. 14 is a cross-sectional view taken along a cutting line J-J' in FIG. 13.
Figure 15:
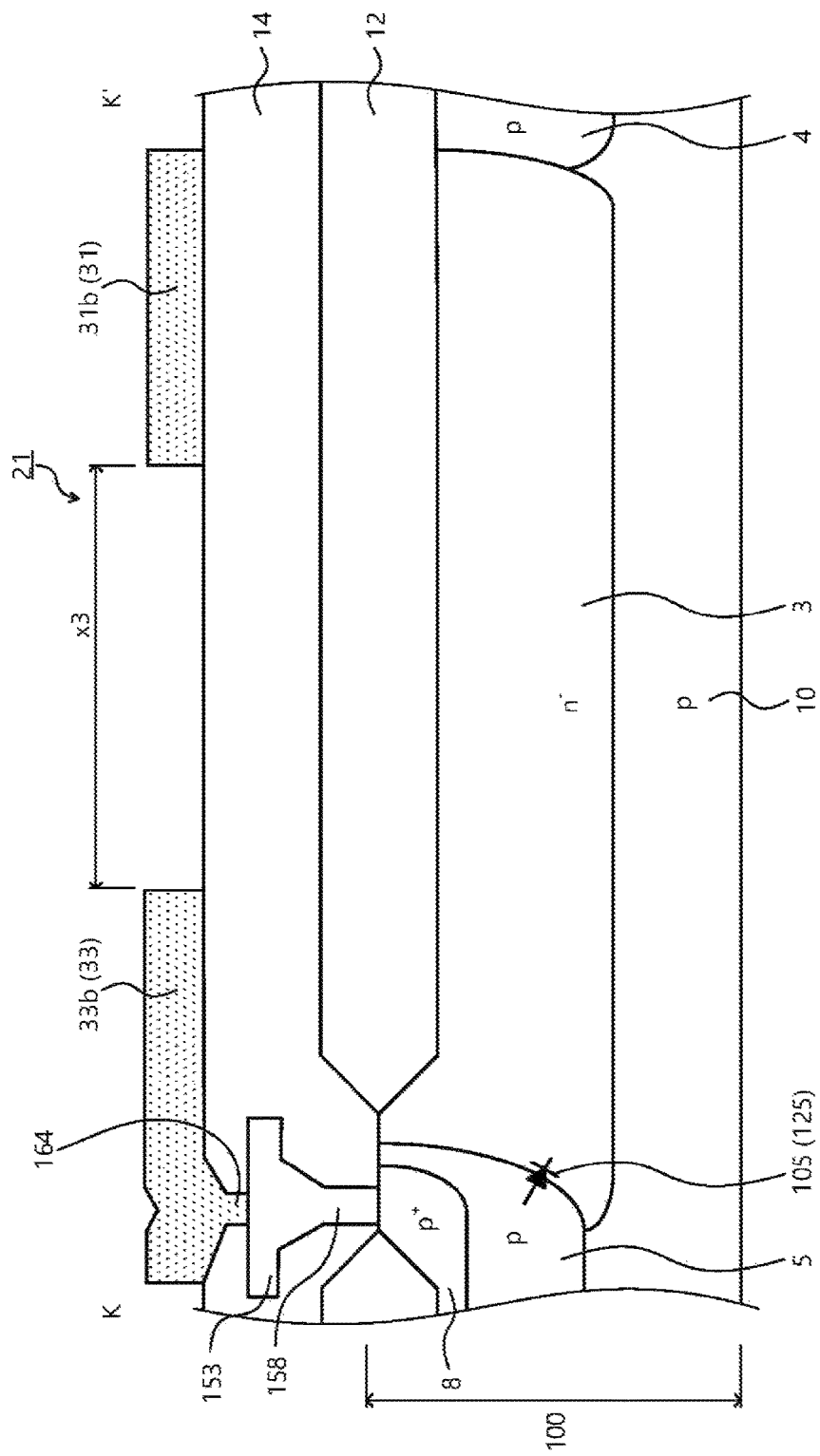
FIG. 15 is a cross-sectional view taken along a cutting line K-K' in FIG. 13.
Figure 16:
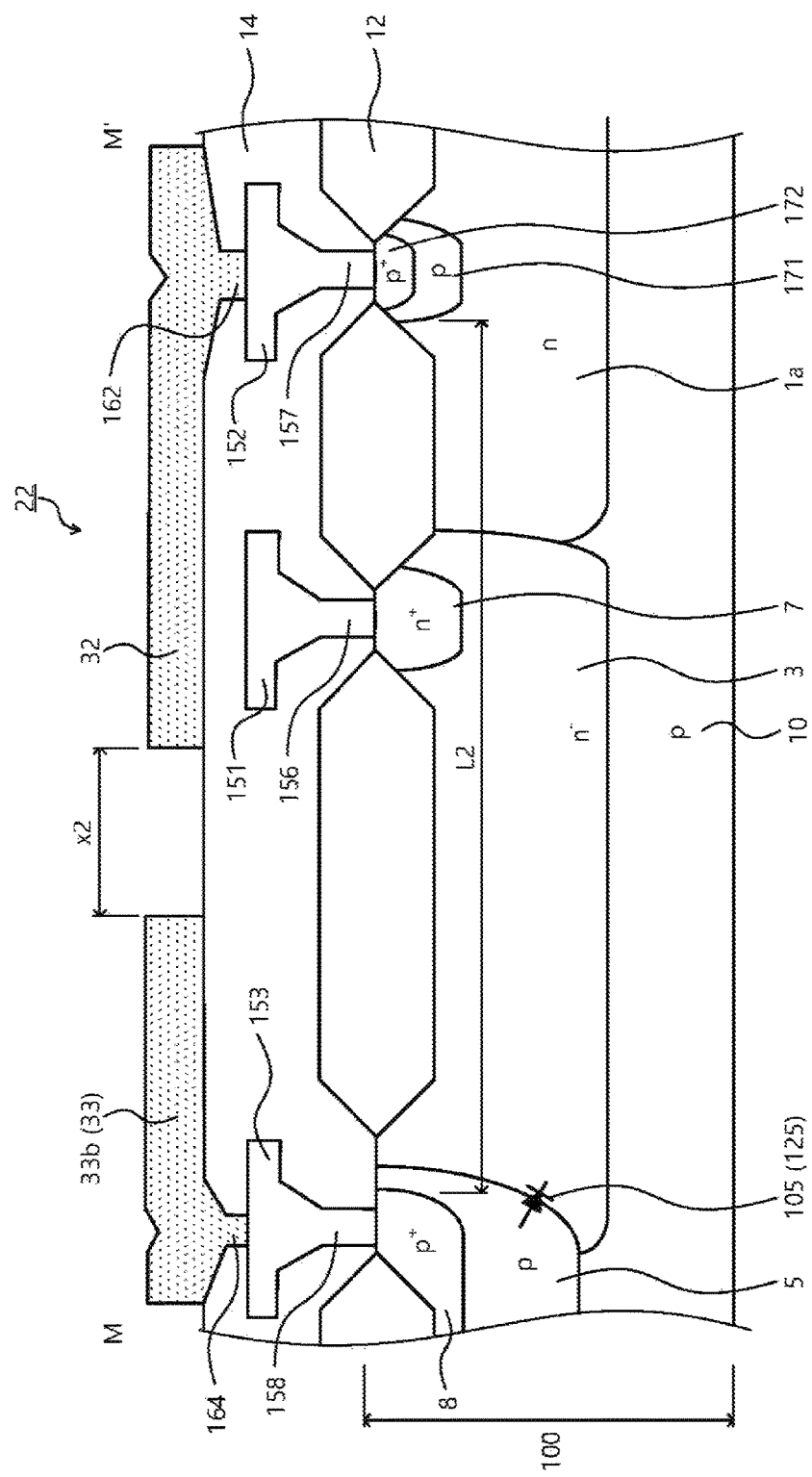
FIG. 16 is a cross-sectional view taken along a cutting line M-M' in FIG. 13.

A configuration of a semiconductor device according to a fourth embodiment will be described. FIG. 13 is a plan diagram of a planar layout of the semiconductor device according to the fourth embodiment. FIG. 14 is a cross-sectional view taken along a cutting line J-J' in FIG. 13. FIG. 15 is a cross-sectional view taken along a cutting line K-K' in FIG. 13. FIG. 16 is a cross-sectional view taken along a cutting line M-M' in FIG. 13. The semiconductor device according to the fourth embodiment differs from the semiconductor device according to the first embodiment in that the second FP 32 also acting as the cathode electrode of the parasitic diode 125 of the HVJT 103 is connected to the electrode pad at the emitter potential VS (hereinafter, referred to as "VS pad") of the upper arm IGBT of the electric power converting bridge circuit.

As depicted in FIG. 13, the first to the third FPs 31 to 33 are arranged in the same planar layouts as those of the first embodiment. The second FP 32 connected to the VS pad and the $n^+$-type pick-up region 7 connected to the H-VDD pad therefore face each other in the depth direction. In the fourth embodiment, a multilayer (in this case, two-layer) wiring electrode structure is therefore configured that is formed by arranging electrodes 151 to 155 in a lower layer of the first to the third FPs 31 to 33 through an interlayer insulating film to electrically connect the H-VDD pad and the $n^+$-type pick-up region 7 to each other. FIG. 13 does not depict the contact electrodes 152 to 155 and the interlayer insulating film. The configuration except for the electrode structure of the semiconductor device according to the fourth embodiment is same as that of the first embodiment (see FIG. 1).

For example, the first FP 31 is electrically connected to the $n^+$-type drain region 6 of the nchMOSFET 104 through the contact electrode of the lower layer not depicted. A contact 161 between the first FP 31 and the contact electrode is arranged in, for example, a substantially straight linear planar layout that has a substantially same size as that of the $n^+$-type drain region 6. The second FP 32 is connected to the VS pad. The second FP 32 is, for example, electrically connected to a $p^+$-type region 172 through the contact electrode not depicted in a portion thereof that extends from the VS pad. The $p^+$-type region 172 is, for example, the $p^+$-type contact region of the nchMOSFET (see a reference numeral "134" of FIG. 22) of the CMOS circuit constituting the high-side circuit portion that is arranged in the high-side circuit formation region 1b.

A contact 162 between the second FP 32 and the contact electrode is arranged in, for example, a substantially straight linear planar layout that has a substantially same size as that of the $p^+$-type region 172. An electrode 151 connected to the H-VDD pad (hereinafter, referred to as "H-VDD electrode") is arranged between the second FP 32 and the $n^+$-type pick-up region 7. The second FP 32 and the H-VDD electrode 151 are electrically insulated from each other by the interlayer insulating film. The H-VDD electrode 151 is in contact with the $n^+$-type pick-up region 7. A contact 156 between the H-VDD electrode 151 and the $n^+$-type pick-up region 7 is arranged in, for example, a substantially straight linear planar layout that has a substantially same size as that of the $n^+$-type pick-up region 7.

The third FP 33 is electrically connected to the $n^+$-type source region 9 of the nchMOSFET 104 through the contact electrode in the lower layer not depicted. A contact 163 between the third FP 33 and the contact electrode connected to the $n^+$-type source region 9 is arranged in, for example, a substantially straight linear planar layout that has a substantially same size as that of the $n^+$-type source region 9. The third FP 33 is electrically connected to the $p^+$-type contact region 8 through the contact electrode in the lower layer not depicted. A contact 164 between the third FP 33 and the contact electrode connected to the $p^+$-type contact region 8 is arranged in, for example, a substantially straight linear planar layout that has a substantially same size as that of the $p^+$-type contact region 8.

The cross-sectional structure of the HVJT 103 will be described. As depicted in FIGS. 14 to 16, similarly to the first embodiment, the n-type diffusion region 1a, the p-type substrate region 2 (see FIG. 13), the n-type diffusion region 3, the first and the second p-type separation regions 4 and 5, the LOCOS film 12, and the interlayer insulating film 14 are provided on the front surface side of the p-type semiconductor substrate 100. The first to the third FPs 31 to 33 extend on the interlayer insulating film 14 similar to the first embodiment. The arrangement of the third and the fourth portions 31b and 31a of the first FP 31, the second FP 32, and the first and the second portions 33a and 33b of the third FP 33 on the interlayer insulating film 14 is same as that of the first embodiment. The distances x1 to x3 from the low potential side FPs to the high potential side FPs on the interlayer insulating film 14 are configured for the same conditions as those of the first embodiment.

As depicted in FIG. 14, the fourth portion 31a of the first FP 31 is in contact with the contact electrode 154 in the lower layer through the contact 161. The contact electrode 154 is in contact with the $n^+$-type drain region 6 of the nchMOSFET 104 through a contact 159. The first portion 33a of the third FP 33 is in contact with the contact electrode 155 in the lower layer through the contact 163. The contact electrode 155 is in contact with the $n^+$-type source region 9 of the nchMOSFET 104 through a contact 160. The third FP 33 and the contact electrode 155 are electrically insulated from the gate electrode 11 of the nchMOSFET 104 by the interlayer insulating film 14. The configuration of the nchMOSFET 104 is same as that of the first embodiment.

As depicted in FIGS. 15 and 16, the second portion 33b of the third FP 33 is in contact with the contact electrode 153 in the lower layer through the contact 164. The contact electrode 153 is in contact only with the $p^+$-type contact region 8 through a contact 158 and is electrically connected to the second p-type separation region 5 through the $p^+$-type contact region 8. As depicted in FIG. 16, the second FP 32 is in contact with the contact electrode 152 in the lower layer through the contact 162. The contact electrode 152 has a potential that is fixed at the source potential (that is, the potential of the VS pad) of the nchMOSFET (see the reference numeral "134" of FIG. 22) of the CMOS circuit constituting the high-side circuit portion. The contact electrode 152 is in contact with the $p^+$-type region 172 through the contact 157.

The $n^+$-type region 172 is selectively provided in the surface layer on the substrate front surface side of a p-type region 171. The p-type region 171 is selectively provided in the surface layer on the substrate front surface side of the n-type diffusion region 1a in the high-side circuit formation region 1b. The p-type region 171 is, for example, a p-type base region of the nchMOSFET (see the reference numeral "134" of FIG. 22) of the CMOS circuit constituting the high-side circuit portion. The configuration of the CMOS circuit constituting the high-side circuit portion exclusive of the p-type region 171 and the $p^+$-type region 172 of the nchMOSFET is not depicted. The H-VDD electrode 151 is in contact with the $n^+$-type pick-up region 7 through the contact 156. The H-VDD electrode 151 faces the second FP 32 in the depth direction through the interlayer insulating film 14.

The balance of the turn OFF capability between the parasitic diode 105 of the HVJT 103 and the level shifter may be adjusted using the width of the spiral wire of the resistive field plate or the width of the conductor layer of the capacitance coupled field plate, by applying the fourth embodiment to the second and the third embodiments. The configuration formed by applying the fourth embodiment to the second embodiment will be described as an example in the sixth embodiment described later.

As above, according to the fourth embodiment, effects identical to those of the first to the third embodiments may be achieved when the second FP also acting as the cathode electrode of the parasitic diode of the HVJT is connected to the VS pad.

Figure 17:
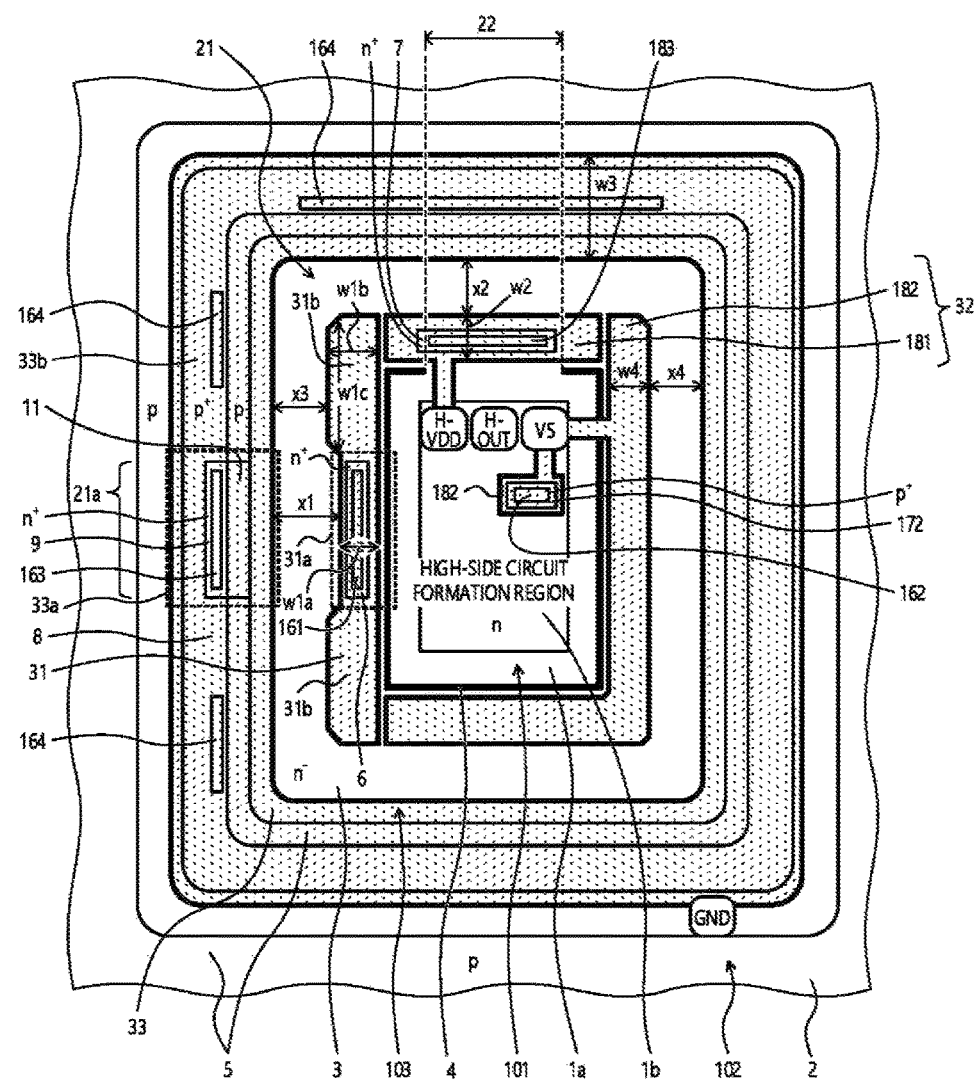
FIG. 17 is a plan diagram of a planar layout of a semiconductor device according to a fifth embodiment.

A configuration of a semiconductor device according to a fifth embodiment will be described. FIG. 17 is a plan diagram of a planar layout of the semiconductor device according to the fifth embodiment. The semiconductor device according to the fifth embodiment differs from the semiconductor device according to the first embodiment in that a portion (hereinafter, referred to as "second partial FP portion") 182 of the second FP 32 also acting as the cathode electrode of the parasitic diode 125 of the HVJT 103 is separated to be connected to the VS pad. The configuration except for the connection destination of the second FP 32 of the semiconductor device according to the fifth embodiment is same as that of the first embodiment (see FIG. 1).

For example, the second FP 32 is arranged in the same planar layout as that of the first embodiment. The second FP 32 is divided into two portions and includes a first partial FP portion 181 connected to the H-VDD pad and the second partial FP portion 182 connected to the VS pad. The first partial FP portion 181 is arranged at a position to face the $n^+$-type pick-up region 7 in the depth direction sandwiching the interlayer insulating film not depicted therebetween and in, for example, a substantially straight linear planar layout along one side of the $n^-$-type diffusion region 3. The first partial FP portion 181 is in contact with the $n^+$-type pick-up region 7. A contact 183 between the first partial FP portion 181 and the $n^+$-type pick-up region 7 is arranged in, for example, a substantially straight linear planar layout that has a substantially same size as that of the $n^+$-type pick-up region 7.

The second partial FP portion 182 is arranged in, for example, a substantial L-shape planar layout along the other two sides of the $n^-$-type diffusion region 3 (the two sides other than the one side for which the first FP 31 is arranged and the one side for which the first partial FP portion 181 is arranged). The three FPs (the first FP 31, and the first and the second partial FP portions 181 and 182) are arranged away from each other on the high potential side of the HVJT 103. The first FP 31, and the first and the second partial FP portions 181 and 182 are arranged away from each other in a planar layout forming one substantially rectangular frame that surrounds the periphery of the high potential side region 101 to be farther outward than the first p-type separation region 4. The second partial FP portion 182 is in contact with the $p^+$-type region 172 in, for example, a portion thereof that extends from the VS pad.

The contact 162 between the second partial FP portion 182 and the $p^+$-type region 172 is arranged in, for example, a substantially straight linear planar layout that has a substantially same size as that of the $n^+$-type region 172. The $n^+$-type region 172 is, for example, the $p^+$-type contact region of the nchMOSFET (see the reference numeral "134" of FIG. 22) of the CMOS circuit that constitutes the high-side circuit portion arranged in the high-side circuit formation region 1b. The intervals x2 and x4 respectively between the first and the second partial FP portions 181 and 182, and the third FP 33 on the interlayer insulating film only have to be smaller than the distance (the interval x1) from the low potential side FP to the high potential side FP of the nchMOSFET 104 (x1>x2 and x1>x4) and may be configured to have different dimensions. The widths w2 and w4 in the direction perpendicular to the longitudinal direction of the first and the second FP units 181 and 182 may be different from each other.

The balance of the turn OFF capability between the parasitic diode 105 of the HVJT 103 and the level shifter may be adjusted using the width of the spiral wire of the resistive field plate or the width of the conductor layer of the capacitance coupled field plate, by applying the fifth embodiment to the second and the third embodiments. The configuration formed by applying the fifth embodiment to the second embodiment will be described as an example in the sixth embodiment described later.

As above, according to the fifth embodiment, effects identical to those of the first to fourth embodiments may also be achieved even when the second FP also acting as the cathode electrode of the parasitic diode of the HVJT is divided into two pieces to be separately connected to the H-VDD pad and the VS pad.

Figure 18:
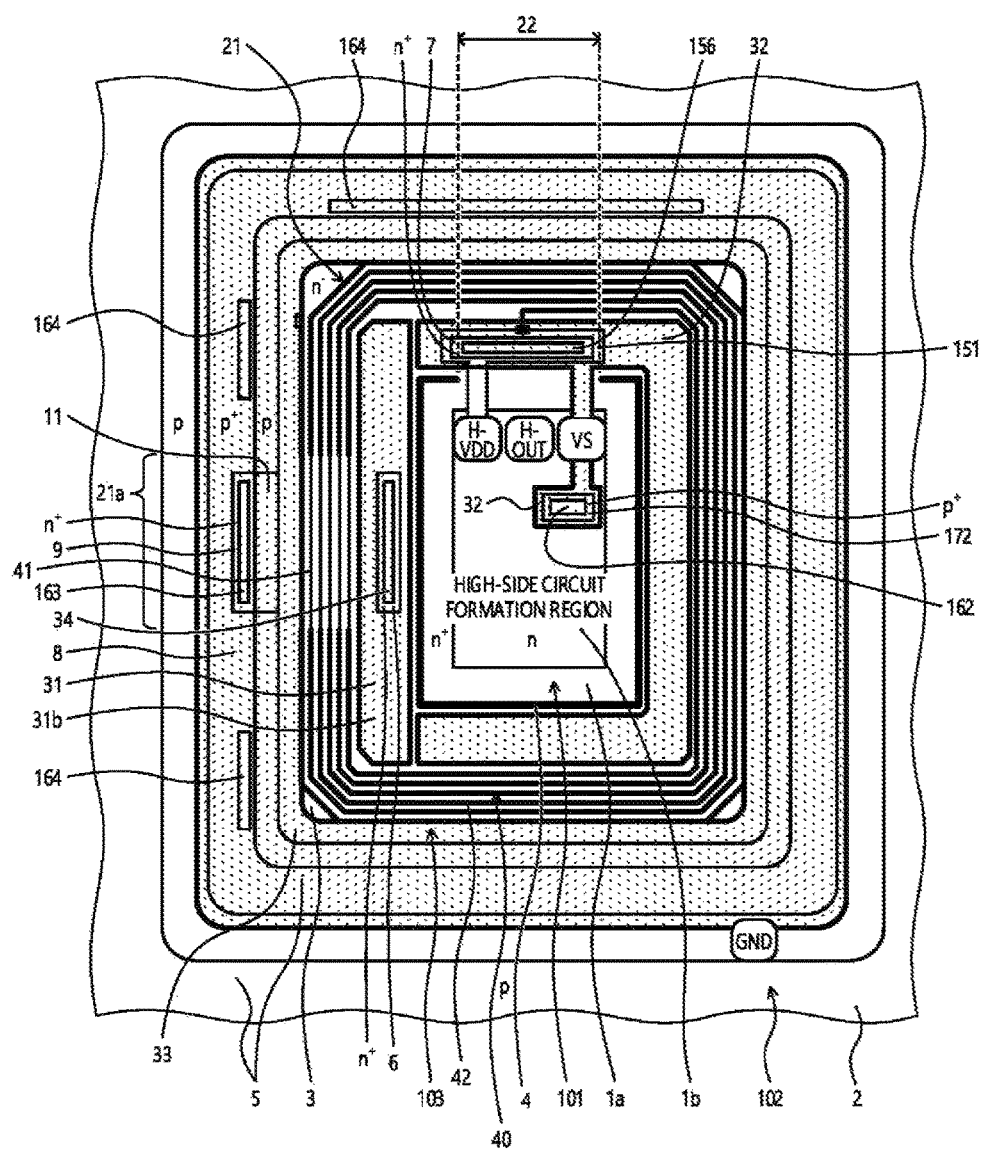
FIG. 18 is a plan diagram of a planar layout of a semiconductor device according to a sixth embodiment.

A configuration of a semiconductor device according to a sixth embodiment will be described. FIG. 18 is a plan diagram of a planar layout of the semiconductor device according to the sixth embodiment. The semiconductor device according to the sixth embodiment is an HVIC formed by applying the fourth embodiment to the second embodiment. Similar to the second embodiment, the balance of the turn OFF capability is adjusted between the parasitic diode of the HVJT 103 and the level shifter, using the resistive field plate 40 arranged between the first and the second FPs 31 and 32, and the third FP 33. The high potential side end of the resistive field plate 40 may be connected to the second FP 32 to be configured to be at the emitter potential VS of the upper arm IGBT of the electric power converting bridge circuit, or may be connected to the H-VDD electrode 151 to be configured to be at the high-side power source potential H-VDD. Similar to the fourth embodiment, the multilayer (for example, two-layer) wiring electrode structure is configured that is formed by arranging electrodes in the lower layer of the first to the third FPs 31 to 33 through the interlayer insulating film to electrically connect the H-VDD pad and the $n^+$-type pick-up region 7 to each other. The H-VDD electrode 151 is arranged in the lower layer of the second FP 32.

As above, according to the sixth embodiment, effects identical to those of the fourth embodiment may be achieved using the resistive field plate.

Figure 19:
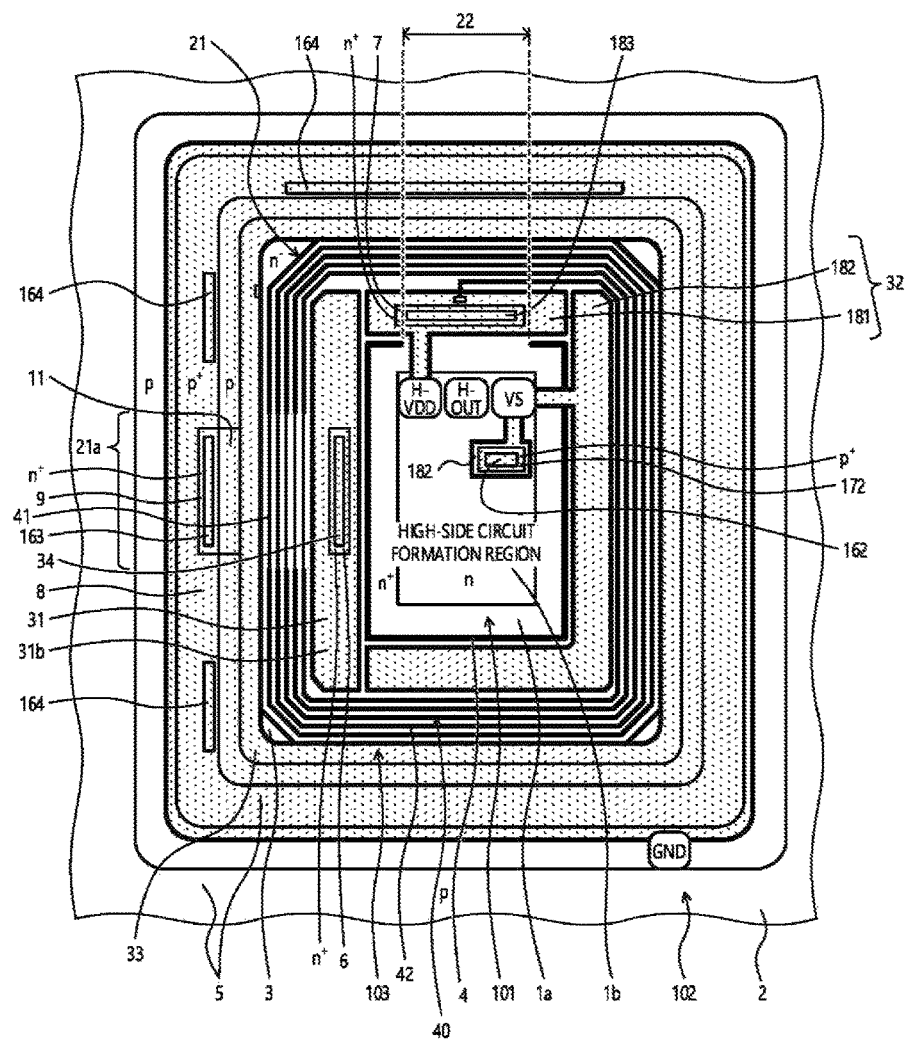
FIGS. 19 and 20 are plan diagrams each of a planar layout of a semiconductor device according to a seventh embodiment.
Figure 20:
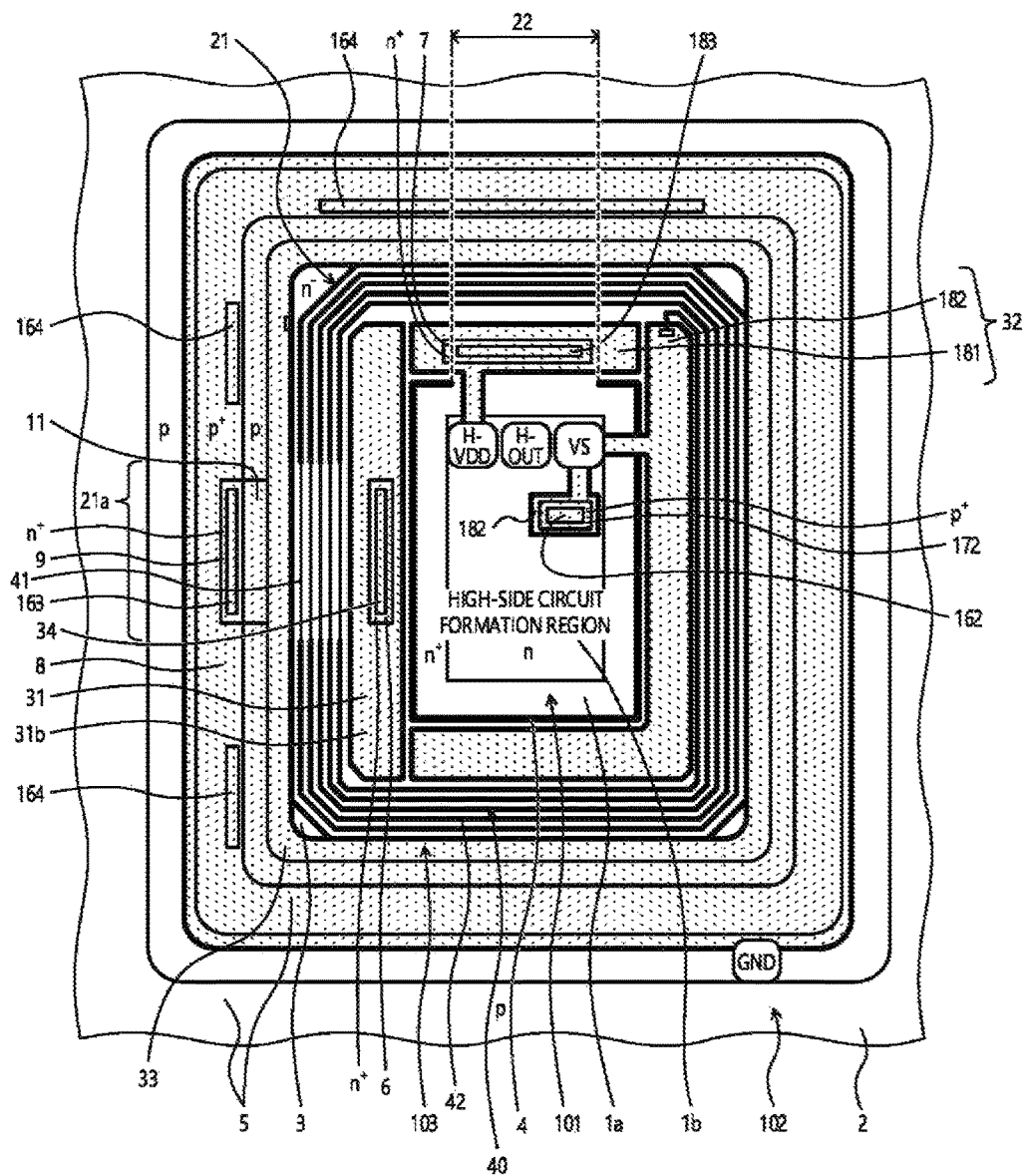

A configuration of a semiconductor device according to a seventh embodiment will be described. FIGS. 19 and 20 are plan diagrams each of a planar layout of the semiconductor device according to the seventh embodiment. The semiconductor device according to the seventh embodiment is an HVIC formed by applying the fifth embodiment to the second embodiment. Similar to the second embodiment, the balance of the turn OFF capability between the parasitic diode of the HVJT 103 and the level shifter is adjusted using the resistive field plate 40 arranged between the first FP 31 and the first and the second partial FP portions 181 and 182 (the second FP 32), and the third FP 33. The high potential side end of the resistive field plate 40 may be connected to the first partial FP portion 181 to be configured to be at the high-side power source potential H-VDD (FIG. 19) or may be connected to the second partial FP portion 182 to be configured to be at the emitter potential VS of the upper arm IGBT of the electric power converting bridge circuit (FIG. 20).

As above, according to the seventh embodiment, effects identical to those of the fifth embodiment may be achieved using the resistive field plate.

Figure 21:
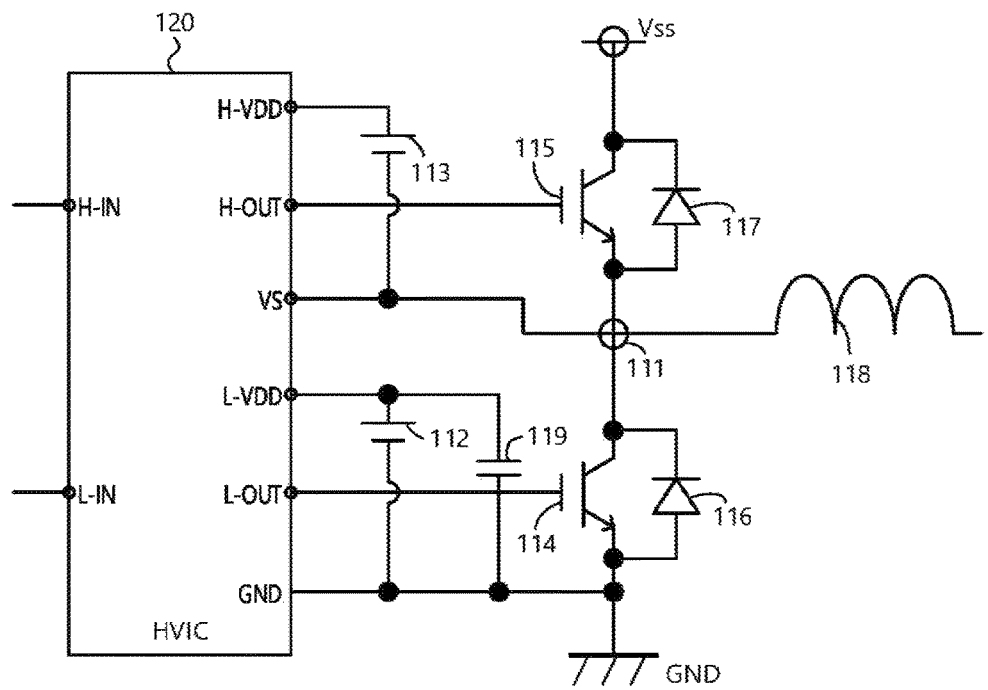
FIG. 21 is a circuit diagram of an example of connection configuration of a general high voltage integrated circuit device.

An example of circuit configuration of the semiconductor device according to the present invention will be described in an eighth embodiment. FIG. 21 is a circuit diagram of an example of connection configuration of a general high voltage integrated circuit device. FIG. 21 depicts an electric power converting device that includes a half-bridge circuit having two switching power devices (IGBTs 114 and 115) connected to each other in series therein. The electric power converting device depicted in FIG. 21 includes an HVIC 120, low voltage power sources (a first and a second low voltage power sources) 112 and 113, IGBTs 114 and 115, free wheel diodes (FWDs) 116 and 117, an L-load (an inductive load) 118, and a capacitor 119.

The electric power converting device depicted in FIG. 21 alternately turns on the upper arm IGBT 115 and the lower arm IGBT 114 of the half-bridge circuit and thereby alternately outputs a high potential and a low potential from a VS terminal 111 that is an output terminal to supply AC power (to cause the AC power to flow) to the L-load 118. The HVIC 120 is a driving element that complementarily turns on and off the IGBT 115 to be the upper arm and the IGBT 114 to be the lower arm of the half-bridge circuit. The HVIC 120 corresponds to the semiconductor device according to each of the first to the third embodiments.

When the high potential is output from the VS terminal 111, the HVIC 120 operates the IGBTs 114 and 115 such that the upper arm IGBT 115 is turned on and the lower arm IGBT 114 is turned off. On the other hand, when the low potential is output from the VS terminal 111, the HVIC 120 operates the IGBTs 114 and 115 such that the upper arm IGBT 115 is turned off and the lower arm IGBT 114 is turned on.

During the operation time period, the HVIC 120 outputs from "L-OUT" a gate signal that drives the lower arm IGBT 114 and that uses the ground potential as a reference. The HVIC 120 outputs from "H-OUT" another gate signal that drives the upper arm IGBT 115 and that uses the potential of the VS terminal 111 (the emitter potential VS of the upper arm IGBT 115) as a reference. The HVIC 120 may have a level-shift function (the level shifter) to output the gate signal that drives the IGBT 115.

The level-raising circuit produces the gate signal that drives the IGBT 115, by raising the level of the input signal at the logic level input from H-IN. H-IN is connected to the gate of the CMOS circuit (the low-side circuit portion not depicted) that is a peripheral circuit on the low side (the pre-stage) of the level-raising circuit. H-IN is an input terminal that receives input of the input signal to be transmitted to the pre-stage low-side circuit portion of the level-raising circuit.

H-OUT is connected to an output terminal of the CMOS circuit (the high side portion not depicted) that is a peripheral circuit of the high side (the post-stage) of the level-raising circuit. H-OUT is connected to the gate of the upper arm IGBT 115 arranged in the post-stage of the HVIC 120. H-OUT is an output terminal supplying the gate signal to the IGBT 115. L-IN is an input terminal receiving input of an input signal to be transmitted to the CMOS circuit that supplies the gate signal to the IGBT 114. The CMOS circuit supplying the gate signal to the IGBT 114 produces the gate signal that drives the IGBT 114, based on the input signal at the logic level input from L-IN.

L-OUT is connected to the output terminal of the CMOS circuit that supplies the gate signal to the IGBT 114. L-OUT is connected to the gate of the lower arm IGBT 114 arranged in the post-stage of the HVIC 120. L-OUT is an output terminal that supplies the gate signal to the IGBT 114.

H-VDD is a terminal connected to the high potential side of the low voltage power source 113 that uses the potential of VS as the reference thereof. L-VDD is a terminal connected to the high potential side of the low voltage power source 112 that uses the potential of GND as the reference thereof. VS is a terminal for an intermediate potential (a floating potential) that varies from the potential on the high potential side Vss of a high voltage power source (a main circuit power source) to the potential of GND, and is at a potential equal to that of the VS terminal 111. GND is the GND terminal. The low voltage power source 112 is a low-side power source connected between L-VDD of the HVIC 120 and GND. The low voltage power source 113 is a high-side power source connected between H-VDD of the HVIC 120 and VS. In the case of a bootstrap circuit method, the low voltage power source 113 includes an external capacitor not depicted that is charged by an external bootstrap diode not depicted that is connected between L-VDD and H-VDD.

The emitter of the IGBT 114 is connected to GND that is the low potential side of the high voltage power source, and the collector thereof is connected to the emitter of the IGBT 115. The collector of the IGBT 115 is connected to the high potential side Vss of the high voltage power source. The FWDs 116 and 117 are respectively connected in inverse-parallel to the IGBTs 114 and 115. The connection point of the collector of the IGBT 114 and the emitter of the IGBT 115 (that is, the output terminal of the half-bridge circuit) is connected to the VS terminal 111. The VS terminal 111 is connected to VS of the HVIC 120 and the L-load 118. The L-load 118 is an AC resistor (reactance) such as, for example, a motor or lighting that operates using a bridge circuit configured by combining a half-bridge circuit (the IGBTs 114 and 115). The capacitor 119 is connected between L-VDD and GND.

Figure 22:
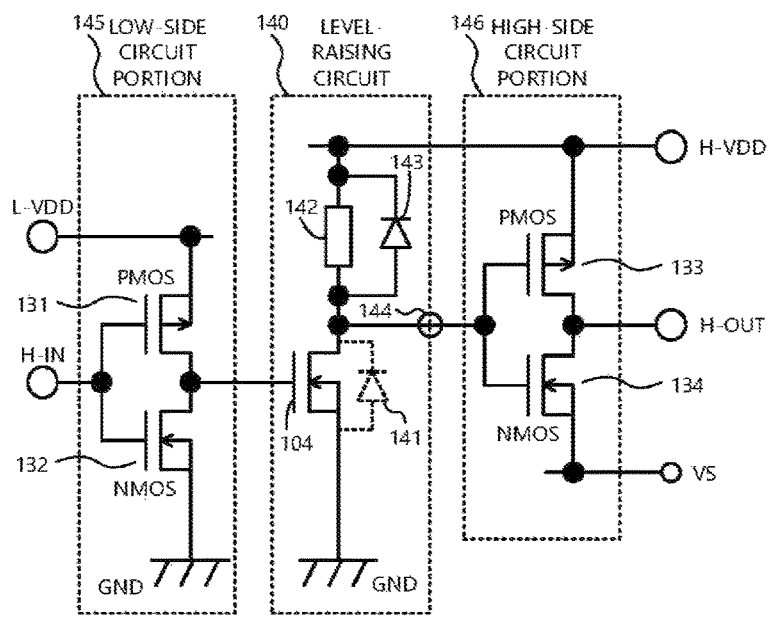
FIG. 22 is a circuit diagram of a configuration of a level-raising circuit.
Figure 23:
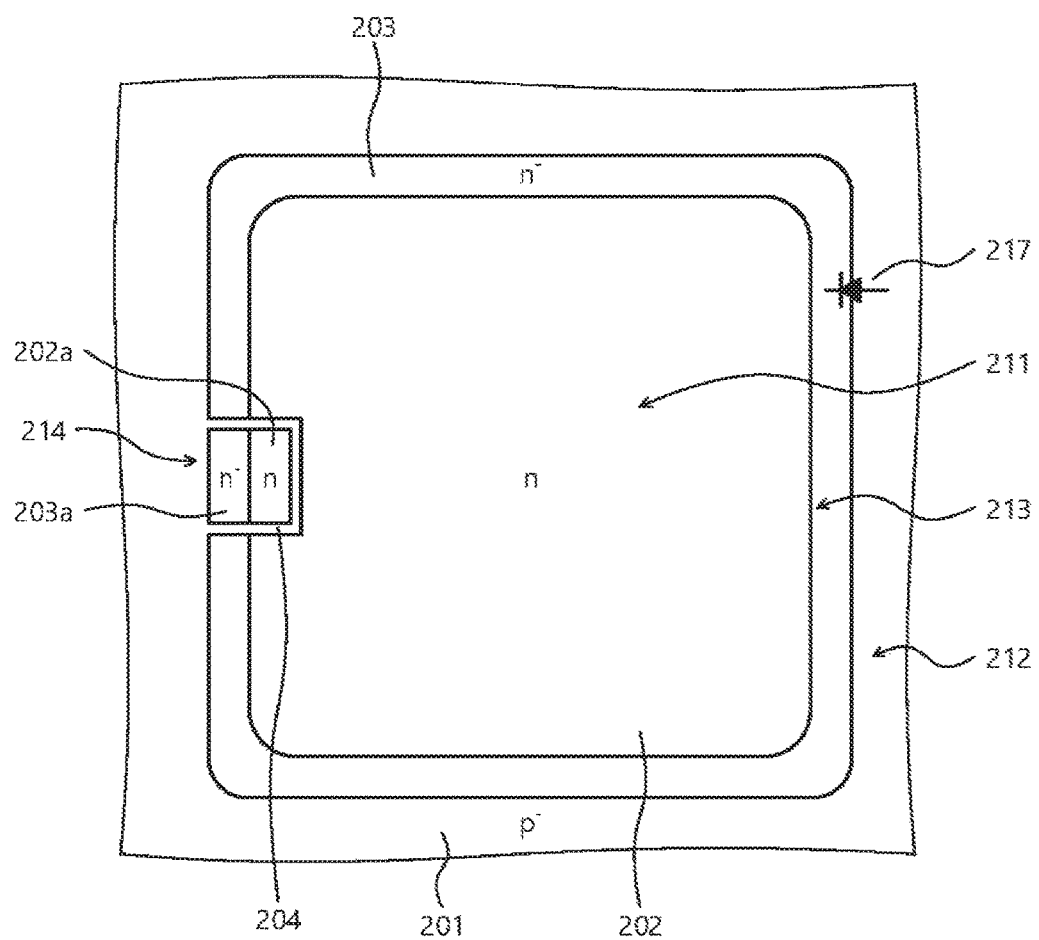
FIGS. 23, 24, 25, and 26 are plan diagrams examples of a planar layout of essential portions of traditional semiconductor devices.
Figure 24:
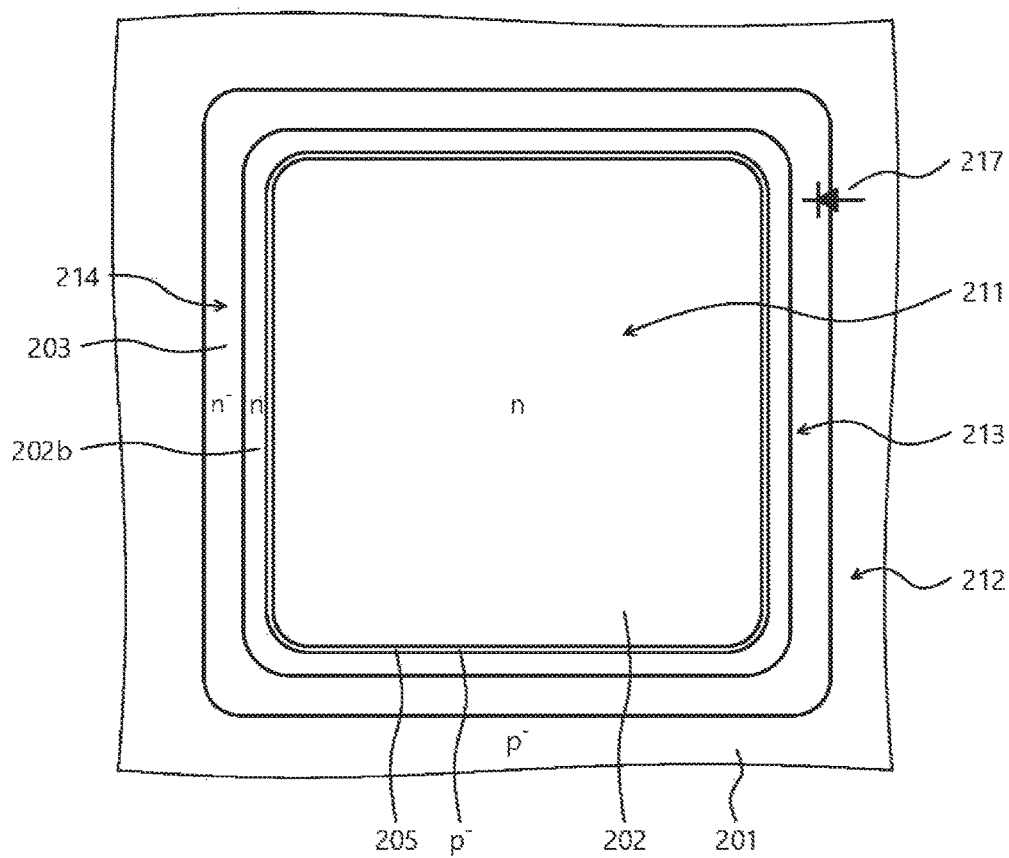
Figure 25:
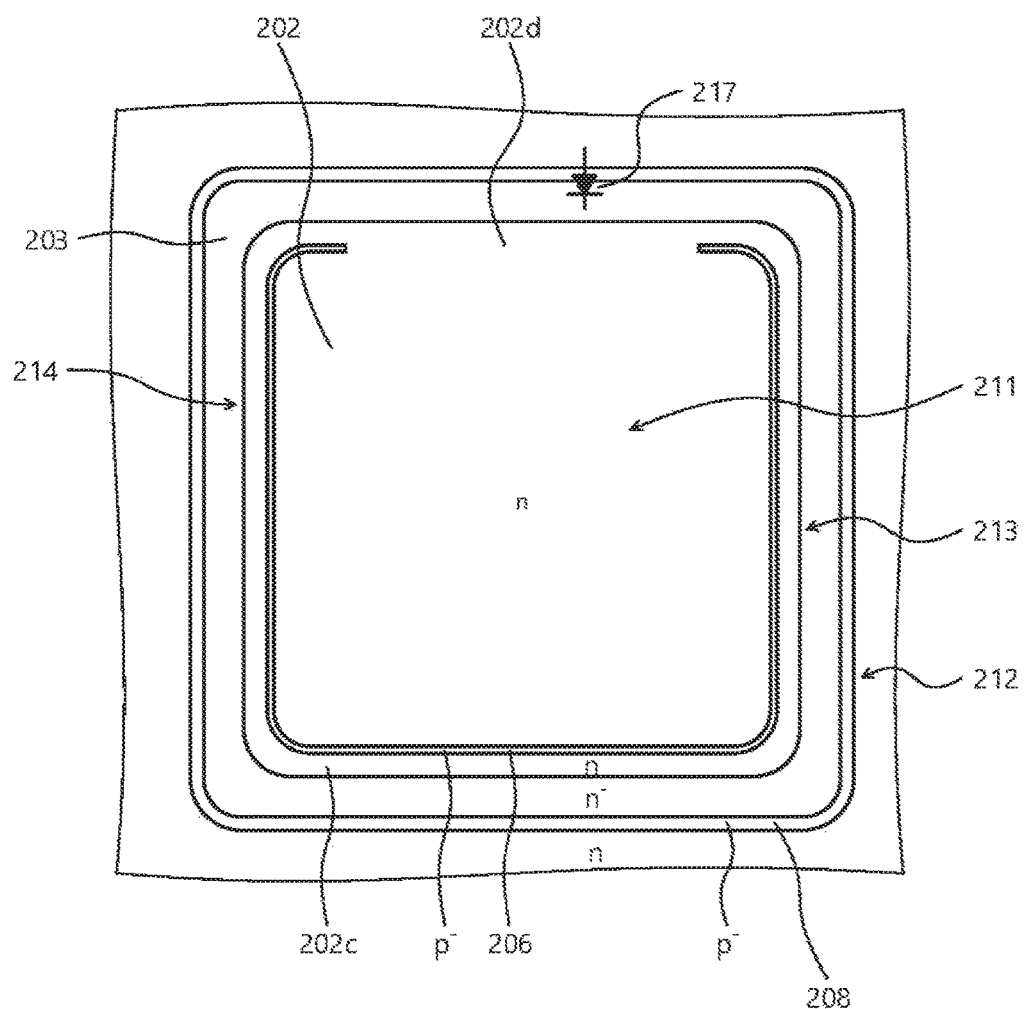
Figure 26:
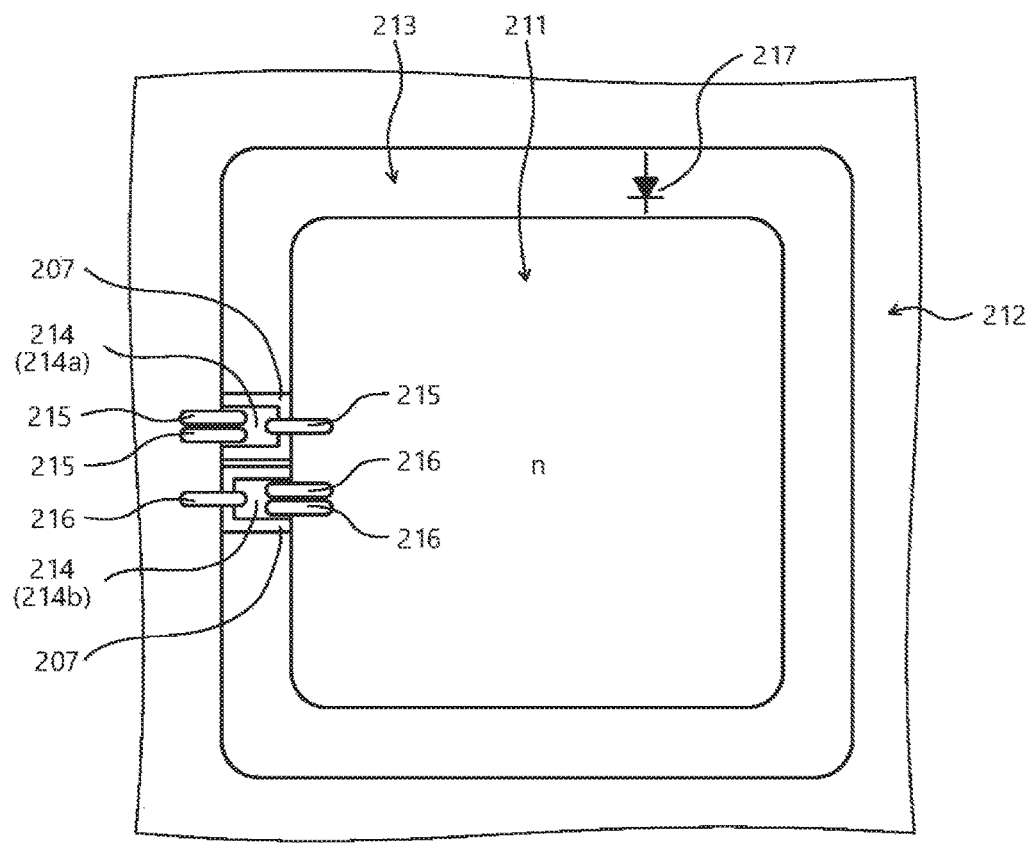

The circuit configuration of the level shifter will be described. FIG. 22 is a circuit diagram of a configuration of the level-raising circuit. FIG. 22 depicts a CMOS circuit that transmits an input signal to the level shifter and a CMOS circuit that transmits an output signal of the level shifter to the post-stage, as peripheral circuits of the level shifter. "H-IN", "H-OUT", "H-VDD", "L-VDD", "VS", and "GND" depicted in FIG. 22 correspond to H-IN, H-OUT, H-VDD, L-VDD, VS, and GND depicted in FIG. 21.

A level-raising circuit 140 depicted in FIG. 22 includes the nchMOSFET 104, a level-shift resistor 142, and a diode 143. The level-raising circuit 140 is necessary when the upper arm IGBT 115 of the half-bridge circuit is an n-channel IGBT. The configuration of the nchMOSFET 104 is same as those of the first to the third embodiments. The drain of the nchMOSFET 104 is connected to one end of the level-shift resistor 142 and the source thereof is connected to the ground. The nchMOSFET 104 incorporates therein a body diode 141 that is connected in inverse-parallel to the nchMOSFET 104. The connection point of the nchMOSFET 104 and the level-shift resistor 142 is an output portion 144 of the level-raising circuit 140.

The other end of the level-shift resistor 142 is connected to H-VDD. The diode 143 is connected in parallel to the level-shift resistor 142. The diode 143 has a function of preventing the level-shift resistor 142 from generating heat and breaking down due to the heat generated when the potential of H-VDD (the high-side power source potential) becomes a potential that is significantly lower than the potential of GND (the ground potential). The diode 143 has a function of preventing excessive voltage from being applied to the gate of the CMOS circuit of the high-side circuit portion 146 described later when overvoltage is applied to H-VDD during the ON operation time period of the nchMOSFET 104. A Zener diode is often used as the diode 143.

A low-side circuit portion 145 is arranged in the pre-stage of the level-raising circuit 140 and a high-side circuit portion 146 is arranged in the post-stage thereof, as peripheral circuits of the level-raising circuit 140. Both the low-side circuit portion 145 and the high-side circuit portion 146 each includes a CMOS circuit formed by complementarily connecting a pchMOSFET (a PMOS) and an nchMOSFET (an NMOS) to each other. The gate of the CMOS circuit of the low-side circuit portion 145 is connected to H-IN and receives input of an input signal transmitted from the HVIC 120. The source of the pchMOSFET 131 of the CMOS circuit of the low-side circuit portion 145 is connected to L-VDD and the source of the nchMOSFET 132 thereof is connected to the ground. The low-side circuit portion 145 and the high-side circuit portion 146 may each include a transmission circuit other than the CMOS circuit.

The connection point (an output terminal) of the pchMOSFET 131 and the nchMOSFET 132 constituting the CMOS circuit of the low-side circuit portion 145 is connected to the gate of the nchMOSFET 104 and transmits the input signal to the level-raising circuit 140. The gate of the CMOS circuit of the high-side circuit portion 146 is connected to the output portion 144 of the level-raising circuit 140 and receives input of the input signal transmitted from the level-raising circuit 140. The source of the pchMOSFET 133 of the CMOS circuit of the high-side circuit portion 146 is connected to H-VDD and the source of the nchMOSFET 134 thereof is connected to VS. The connection point of the pchMOSFET 133 and the nchMOSFET 134 constituting the CMOS circuit of the high-side circuit portion 146 is connected to H-OUT and transmits the input signal to the HVIC.

In the level-raising circuit 140, when the input signal from H-IN is input to the gate of the CMOS circuit of the low-side circuit portion 145, the signal passes through the CMOS circuit of the low-side circuit portion 145 and is input to the gate of the nchMOSFET 104 of the level-raising circuit 140. In response to the input of the input signal, the nchMOSFET 104 is turned on or off, and an output signal is output from the output portion 144 of the level-raising circuit 140, and is input to the gate of the CMOS circuit of the high-side circuit portion 146. In response to the input of this input signal, the CMOS circuit of the high-side circuit portion 146 is turned on or off, and an output signal of the CMOS circuit of the high-side circuit portion 146 (a signal whose level is raised by the level-raising circuit 140) is output from H-OUT. This output signal is converted into a signal that uses the potential of the VS terminal 111 (see FIG. 21) as the reference thereof, and the converted signal is input to the gate of the upper arm IGBT 115. In response to the input of this input signal, the upper arm IGBT 115 of the half-bridge circuit is turned on or off.

As above, according to the eighth embodiment, the first to the seventh embodiments are applicable.

In the above, without limitation to the embodiments, the present invention may variously be modified within a scope not departing from the spirit of the invention. For example, the p-type separation region may electrically separate completely the high potential side region and the HVJT from each other (a configuration not having the second HVJT portion provided therein), or the p-type separation region may not be provided between the high potential side region and the HVJT (a configuration not having the first HVJT portion provided therein). Plural configuration portions each including the high potential side region, the low potential side region, and the HVJT may be arranged on the same semiconductor chip. The $n^+$-type pick-up region also acting as the cathode contact region of the parasitic diode of the HVJT may be arranged in the first HVJT portion. The resistive field plate and the capacitance coupled field plate only have to be arranged in the HVJT and may be arranged in the interlayer insulating film that covers the first to the third FPs.

In the first to the third embodiments, the element separation scheme may be changed variously. For example, the high potential side region and the HVJT, and the HVJT and the low potential side region may each be electrically separated from each other by arranging a trench filled with an insulating layer instead of the p-type separation region. In the embodiments, the first conductivity type is set to be the p type and the second conductivity type is set to be the n type, however, the present invention is further implemented when the first conductivity type is set to be the n type and the second conductivity type is set to be the p type.

However, with the traditional semiconductor devices depicted in FIGS. 23 to 26, the length between predetermined regions, i.e., a factor determining the drift length, is equal for the parasitic diode 217 of the region exclusive of the level shifter 214 of the HVJT 213 and the level shifter 214, and the OFF breakdown voltage is also equal therefor. In the parasitic diode 217, the length between the predetermined regions, i.e., a factor determining the drift length, is the length (the width) in the direction in which drift current flows (the direction from the high potential side region 211 toward the low potential side region 212) between a cathode contact region (an $n^+$-type region at a high potential, not depicted) and an anode contact region (a p$^+$-type region at a low potential, not depicted). In the level shifter 214, the length is the length in the direction in which drift current flows between a drain region not depicted and a source region not depicted.

The following problem arises consequent to the OFF breakdown voltages of the parasitic diode 217 and the level shifter 214 being equal as above. When a surge such as electro-static discharge (ESD) is input during an OFF time period and the level shifter 214 and the parasitic diode 217 simultaneously breakdown, currents (hereinafter, referred to as "avalanche currents") in the level shifter 214 and the parasitic diode 217 rapidly increase substantially evenly. Parasitic operation is induced (a parasitic npn-transistor is turned on) by the avalanche current in the level shifter 214 that includes the re-channel MOSFET and the like, and the level shifter 214 therefore tends to breakdown compared to the parasitic diode 217.

Examples of a method for solving this problem include resolving the imbalance of the turn OFF capability between the parasitic diode 217 of the region exclusive of the level shifter 214 of the HVJT 213 and the level shifter 214 by limiting the avalanche current flowing through the level shifter 214 by increasing the level-shift resistance. For the level shifter 214, to raise the level, a level-shift resistor is arranged therein between a drain not depicted of the level shifter 214 and a high-side power source (the power source to which the maximal potential of the high-side circuit portion is applied).

Examples of another method of improving the turn OFF capability of the level shifter 214 include improving the surge capability of the level shifter 214 alone by increasing the size of the level shifter 214 by increasing the gate width of the level shifter 214 or the like. In this case, however, the parasitic capacitance (output capacitance Coss) of the level shifter 214 is increased and the amount of variation of the potential in the level shifter 214 changes by dV/dt noise (variation of voltage per time applied between the source and the drain consequent to noise), and the dV/dt noise capability is thereby adversely influenced. Problems such as an increase of the chip footprint of the level shifter 214 and an increase of the amount of the self-heating, result from the increase of the device size of the level shifter 214.

When an ESD surge is input from a high-side power source terminal of the HVJC between this terminal and the ground potential, in a human body model (HBM), a surge of about several thousand V is transitionally input. The level shifter is arranged between the high-side circuit portion and the low-side circuit portion, and operates using the high-side power source potential as the maximal potential and the ground potential as the minimum potential. The HVJC may breakdown at a level shifter portion whose resistance to breakdown is smaller than that of the HVJT when a surge exceeding the breakdown voltage of the HVIC is applied from the high-side power source of the HVIC between the power source and the ground potential.

According to the invention, the electric field applied to the drift region (a second semiconductor region) of the level shifter arranged in the HVJT (the pn-junction between the second and the third semiconductor regions) may be alleviated to a greater extent than that of the portion exclusive of the level shifter of the HVJT. The OFF breakdown voltage of the level shifter may therefore be configured to be higher than the OFF breakdown voltage of the parasitic diode in the portion other than the level shifter of the HVJT. The flow of the avalanche current in the level shifter resulting in the breakdown with the operation of the parasitic npn-transistor due to the avalanche current acting as the trigger thereof may be suppressed, and the surge current may be caused to dominantly flow in the region exclusive of the level shifter of the HVJT before the level shifter is subject to avalanche breakdown. According to the invention, the chip area is not increased because the balance of the resistance to breakdown during the OFF time period (the OFF breakdown voltage difference) of the parasitic diode of the region exclusive of the level shifter of the HVJT, and the level shifter may be adjusted by configuring the dimensions of the first to the third electrodes.

According to the semiconductor device of the present invention, in the HVIC including the HVJT and the level shifter on a single semiconductor chip, an effect is achieved in that increases of the chip area may be suppressed and the surge capability may be improved.

As described, the semiconductor device according to the present invention is useful for a high voltage integrated circuit device used in a power converting equipment, and a power supply devices such as in various industrial machines, and the like.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising: a first semiconductor region of a second conductivity type selectively provided in a surface layer of a semiconductor substrate;
    a second semiconductor region of the second conductivity type and surrounding a periphery of the first semiconductor region;
    a third semiconductor region of a first conductivity type provided to be in contact with the second semiconductor region and to surround and to be away from the first semiconductor region;
    a fourth semiconductor region of the second conductivity type, selectively provided in the third semiconductor region;
    a fifth semiconductor region of the second conductivity type, selectively provided in the first semiconductor region or the second semiconductor region to face the fourth semiconductor region with no intervening second conductivity type semiconductor regions formed apart from the fifth semiconductor region other than the semiconductor region in which the fifth semiconductor region is selectively provided, the fifth semiconductor region having an impurity concentration that is higher than that of the second semiconductor region;
    a gate electrode provided through a gate insulating film, on a surface of a portion of the third semiconductor region between the fourth semiconductor region and the second semiconductor region;
    a sixth semiconductor region of the second conductivity type, selectively provided in the first semiconductor region or the second semiconductor region to be away from the fifth semiconductor region, the sixth semiconductor region having an impurity concentration that is higher than that of the second semiconductor region;
    a seventh semiconductor region of the first conductivity type, selectively provided in the first semiconductor region to be away from the fifth semiconductor region;
    an interlayer insulating film that covers the second semiconductor region;

a first electrode electrically connected to the fifth semiconductor region, and extending on the interlayer insulating film;

a second electrode electrically connected to the sixth semiconductor region or the seventh semiconductor region, and extending on the interlayer insulating film; and a third electrode electrically connected to the third semiconductor region and the fourth semiconductor region, and extending on the interlayer insulating film to face the first electrode and the second electrode, wherein on the interlayer insulating film, an interval across which the first electrode faces a first portion of the third electrode facing the fourth semiconductor region in a depth direction is larger than an interval between the second electrode and the third electrode.

2. The semiconductor device according to claim 1, wherein on the interlayer insulating film, the interval across which the first electrode faces the first portion of the third electrode is equal to or than larger an interval between the first electrode and a second portion of the third electrode other than the first portion of the third electrode.

3. The semiconductor device according to claim 2, wherein a third portion of the first electrode, facing the second portion of the third electrode, overhangs more on the interlayer insulating film toward a side of the third electrode than a fourth portion of the first electrode, facing the first portion of the third electrode.

4. The semiconductor device according to claim 2, comprising:

a fourth electrode electrically connected to the seventh semiconductor region or the sixth semiconductor region, and extending on the interlayer insulating film, the fourth electrode being provided away from the second electrode, wherein, on the interlayer insulating film, the interval across which the first electrode faces the first portion of the third electrode is larger than an interval between the second portion of the third electrode and the fourth electrode.

5. The semiconductor device according to claim 1, wherein the first electrode and the second electrode are arranged to be away from each other and in a layout so as to form a ring surrounding the periphery of the first semiconductor region.

6. The semiconductor device according to claim 1, wherein the third electrode is arranged to be away from the first electrode and the second electrode and to be positioned farther outward than the first electrode and the second electrode, the third electrode arranged in a layout so as to surround the periphery of the first semiconductor region.

7. A semiconductor device, comprising:

a first semiconductor region of a second conductivity type selectively provided in a surface layer of a semiconductor substrate;

a second semiconductor region of the second conductivity type and surrounding a periphery of the first semiconductor region;

a third semiconductor region of a first conductivity type provided to be in contact with the second semiconductor region and to surround and to be away from the first semiconductor region;

a fourth semiconductor region of the second conductivity type, selectively provided in the third semiconductor region;

a fifth semiconductor region of the second conductivity type, selectively provided in the first semiconductor region or the second semiconductor region to face the fourth semiconductor region, the fifth semiconductor region having an impurity concentration that is higher than that of the second semiconductor region;

a gate electrode provided through a gate insulating film, on a surface of a portion of the third semiconductor region between the fourth semiconductor region and the second semiconductor region;

a sixth semiconductor region of the second conductivity type, selectively provided in the first semiconductor region or the second semiconductor region to be away from the fifth semiconductor region, the sixth semiconductor region having an impurity concentration that is higher than that of the second semiconductor region;

a seventh semiconductor region of the first conductivity type, selectively provided in the first semiconductor region to be away from the fifth semiconductor region;

an interlayer insulating film that covers the second semiconductor region;

a first electrode electrically connected to the fifth semiconductor region; a second electrode electrically connected to the sixth semiconductor region or the seventh semiconductor region;

a third electrode electrically connected to the third semiconductor region and the fourth semiconductor region; and a fourth electrode provided in the interlayer insulating film between the second electrode and the third electrode, wherein the fourth electrode has a width that is smaller at a first portion thereof that is between the fourth semiconductor region and the fifth semiconductor region in a plan view than at a second portion thereof that is not between the fourth semiconductor region and the fifth semiconductor region.

8. The semiconductor device according to claim 7, wherein the fourth electrode is connected to the second electrode and the third electrode and includes a resistive body arranged in a spiral layout so as to surround a periphery of the first semiconductor region and reach a side of the third semiconductor region from a side of the first semiconductor region.

9. The semiconductor device according to claim 7, wherein the fourth electrode includes a plurality of conductor layers arranged in an annular layout so as to surround a periphery of the first semiconductor region and to be away from each other.

10. The semiconductor device according to claim 7, wherein the fourth electrode includes polysilicon.

11. The semiconductor device according to claim 7, wherein the first electrode and the second electrode are arranged to be away from each other and in a layout so as to form a ring surrounding the periphery of the first semiconductor region.

12. The semiconductor device according to claim 7, wherein the third electrode is arranged to be away from the first electrode and the second electrode and to be positioned farther outward than the first electrode and the second electrode, the third electrode arranged in a layout so as to surround the periphery of the first semiconductor region.

13. A semiconductor device, comprising:

a first semiconductor region of a second conductivity type selectively provided in a surface layer of a semiconductor substrate;

a second semiconductor region of the second conductivity type and surrounding a periphery of the first semiconductor region;

a third semiconductor region of a first conductivity type provided to be in contact with the second semiconductor region and to surround and to be away from the first semiconductor region;

a fourth semiconductor region of the second conductivity type, selectively provided in the third semiconductor region;

a fifth semiconductor region of the second conductivity type, selectively provided in the first semiconductor region or the second semiconductor region to face the fourth semiconductor region, the fifth semiconductor region having an impurity concentration that is higher than that of the second semiconductor region;

a gate electrode provided through a gate insulating film, on a surface of a portion of the third semiconductor region between the fourth semiconductor region and the second semiconductor region;

a sixth semiconductor region of the second conductivity type, selectively provided in the first semiconductor region or the second semiconductor region to be away from the fifth semiconductor region, the sixth semiconductor region having an impurity concentration that is higher than that of the second semiconductor region;

a seventh semiconductor region of the first conductivity type, selectively provided in the first semiconductor region to be away from the fifth semiconductor region;

an interlayer insulating film that covers the second semiconductor region;

a first electrode electrically connected to the fifth semiconductor region, and extending on the interlayer insulating film;

a second electrode electrically connected to the sixth semiconductor region or the seventh semiconductor region, and extending on the interlayer insulating film; and a third electrode electrically connected to the third semiconductor region and the fourth semiconductor region, and extending on the interlayer insulating film to face the first electrode and the second electrode, wherein, on the interlayer insulating film, a first interval across which the first electrode faces, with no intervening electrodes, a first portion of the third electrode facing the fourth semiconductor region in a depth direction is larger than a second interval across which the second electrode faces, with no intervening electrodes, the third electrode.

* * * * *